(12) United States Patent
Richardson et al.

(10) Patent No.: US 7,673,223 B2
(45) Date of Patent: *Mar. 2, 2010

(54) NODE PROCESSORS FOR USE IN PARITY CHECK DECODERS

(75) Inventors: Tom Richardson, South Orange, NJ (US); Vladimir Novichkov, Glenview, IL (US)

(73) Assignee: QUALCOMM Incorporated, San Diego, CA (US)

( * ) Notice: Subject to any disclaimer, the term of this patent is extended or adjusted under 35 U.S.C. 154(b) by 589 days.

This patent is subject to a terminal disclaimer.

(21) Appl. No.: 11/178,951

(22) Filed: Jul. 11, 2005

(65) Prior Publication Data

US 2005/0257124 A1 Nov. 17, 2005

Related U.S. Application Data

(63) Continuation of application No. 10/117,264, filed on Apr. 4, 2002, now Pat. No. 6,938,196, and a continuation-in-part of application No. 09/975,331, filed on Oct. 10, 2001, now Pat. No. 6,633,856.

(60) Provisional application No. 60/328,469, filed on Oct. 10, 2001, provisional application No. 60/298,480, filed on Jun. 15, 2001.

(51) Int. Cl.
*H03M 13/00* (2006.01)
(52) U.S. Cl. .................................. 714/780; 714/709
(58) Field of Classification Search ............... 714/780, 714/709
See application file for complete search history.

(56) References Cited

U.S. PATENT DOCUMENTS 3,542,756 A 11/1970 Gallager (Continued)

FOREIGN PATENT DOCUMENTS

EP 1158682 11/2001

(Continued)

OTHER PUBLICATIONS

Li Ping, Member, IEEE, and W. K. Leung, Student Member, IEEE; Decoding Low Density Parity Check Codes with Finite Quantization Bits; IEEE Communications Letters, vol. 4, No. 2, Feb. 2000.*

(Continued)

*Primary Examiner*—Joseph D Torres
(74) *Attorney, Agent, or Firm*—James K. O'Hare

(57) ABSTRACT

Techniques for implementing message passing decoders, e.g., LDPC decoders, are described. To facilitate hardware implementation messages are quantized to integer multiples of ½ ln2. Messages are transformed between more compact variable and less compact constraint node message representation formats. The variable node message format allows variable node message operations to be performed through simple additions and subtractions while the constraint node representation allows constraint node message processing to be performed through simple additions and subtractions. Variable and constraint nodes are implemented using an accumulator module, subtractor module and delay pipeline. The accumulator module generates an accumulated message sum. The accumulated message sum for a node is stored and then delayed input messages from the delay pipeline are subtracted there from to generate output messages. The delay pipeline includes a variable delay element making it possible to sequentially perform processing operations corresponding to nodes of different degrees.

11 Claims, 15 Drawing Sheets

U.S. PATENT DOCUMENTS

| | | | |
|---|---|---|---|
| 3,665,396 | A | 5/1972 | Forney, Jr. |
| 4,295,218 | A | 10/1981 | Tanner |
| 4,449,190 | A * | 5/1984 | Flanagan et al. ............... 706/22 |
| 4,561,092 | A | 12/1985 | Shaver |
| 4,726,037 | A * | 2/1988 | Jayant ......................... 375/245 |
| 4,914,657 | A | 4/1990 | Walter et al. |
| 4,972,415 | A | 11/1990 | Walter et al. |
| 5,146,324 | A * | 9/1992 | Miller et al. ........... 375/240.03 |
| 5,157,671 | A | 10/1992 | Karplus |
| 5,271,042 | A | 12/1993 | Borth et al. |
| 5,293,489 | A | 3/1994 | Furui et al. |
| 5,313,609 | A | 5/1994 | Baylor et al. |
| 5,317,672 | A * | 5/1994 | Crossman et al. ........... 704/229 |
| 5,396,518 | A | 3/1995 | How |
| 5,457,704 | A | 10/1995 | Hoeher et al. |
| 5,526,501 | A | 6/1996 | Shams |
| 5,615,298 | A | 3/1997 | Chen |
| 5,671,221 | A | 9/1997 | Yang |
| 5,860,085 | A | 1/1999 | Stormon et al. |
| 5,864,703 | A | 1/1999 | Van Hook et al. |
| 5,867,538 | A | 2/1999 | Liu |
| 5,892,962 | A | 4/1999 | Cloutier |
| 5,933,650 | A | 8/1999 | Van Hook et al. |
| 5,968,198 | A | 10/1999 | Hassan |
| 6,002,881 | A | 12/1999 | York et al. |
| 6,073,250 | A | 6/2000 | Luby et al. |
| 6,081,909 | A | 6/2000 | Luby et al. |
| 6,081,918 | A | 6/2000 | Spielman |
| 6,163,870 | A | 12/2000 | Luby et al. |
| 6,195,777 | B1 | 2/2001 | Luby et al. |
| 6,247,158 | B1 | 6/2001 | Smallcomb |
| 6,266,758 | B1 | 7/2001 | Van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B2 | 11/2002 | Smallcomb |
| 6,526,538 | B1 | 2/2003 | Hewitt |
| 6,539,367 | B1 * | 3/2003 | Blanksby et al. ............... 706/14 |
| 6,619,430 | B2 | 9/2003 | Zhong et al. |
| 6,633,856 | B2 | 10/2003 | Richardson et al. |
| 6,700,867 | B2 | 3/2004 | Classon et al. |
| 6,718,504 | B1 | 4/2004 | Coombs et al. |
| 6,731,700 | B1 | 5/2004 | Yaknich et al. |
| 6,751,770 | B2 | 6/2004 | Morelos-Zaragoza |
| 6,754,804 | B1 | 6/2004 | Hudepohl et al. |
| 6,757,122 | B1 | 6/2004 | Kuzhetsov et al. |
| 6,771,197 | B1 | 8/2004 | Yedida et al. |
| 6,938,196 | B2 * | 8/2005 | Richardson et al. .......... 714/752 |
| 6,957,375 | B2 | 10/2005 | Richardson |
| 6,961,888 | B2 | 11/2005 | Jin et al. |
| 6,973,375 | B2 | 12/2005 | Brodeur et al. |
| 7,133,853 | B2 | 11/2006 | Richardson et al. |
| 7,174,495 | B2 | 2/2007 | Boutillon et al. |
| 7,373,581 | B2 | 5/2008 | Okamura et al. |
| 2002/0002695 | A1 | 1/2002 | Kschischang et al. |
| 2003/0065989 | A1 | 4/2003 | Yedida et al. |
| 2004/0034828 | A1 | 2/2004 | Hocevar |

FOREIGN PATENT DOCUMENTS

| | | |
|---|---|---|
| TW | 299539 | 3/1997 |

OTHER PUBLICATIONS

Richardson et al. The capacity of low-density parity-check codes under message-passing Decoding, IEEE Transactions on Information Theory; pp. 599-618, Feb. 2001, (same inventor) whole document.

Paranchych et al. Performance of a digital symbol synchronizer in cochannel interference and noise, IEEE Transactions on Communications, pp. 1945-1954; Nov. 2000, whole document.

NN77112415. Digital Encoding of Wide Range Dynamic Analog Signals, IBM Tech. Disclosure Bulletin, Nov. 1, 1997, vol. No. 20; Issue No. 6, pp. 2415-2417, whole document.

NN9210335. Hierarchical Coded Modulation of Data with Fast Decaying Probability Distributions, IBM Tech. Disclosure Bulletin, Oct. 1992, vol. No. 35; Issue No. 5; pp. 335-336, whole document.

Sorokine, V. et al. Innovative coding scheme for spread-spectrum communications, The Ninth IEEE International Symposium on Indoor and Mobile Radio Communications, pp. 1491-1495, vol. 3; Sep. 1998, whole document.

T. Moors and M. Veeraraghavan, "Preliminary specification and explanation of Zing: An end-to-end protocol for transporting bulk data over optical circuits", pp. 1-55 (May 2001).

T. Richardson, A. Shokrollahi, R. Urbanke, "Design of Capacity-Approaching Irregular Low-Density Parity-Check Codes", pp. 1-43 (Mar. 2001).

T. Richardson and R. Urbanke, "An Introduction to the Analysis of Iterative Coding Systems", pp. 1-36.

W. W. Peterson and E.J. Weldon, Jr., "Error-Correcting Codes", Second Edition, The Massachusetts Institute of Technology, pp. 212-213,261-263, 362, (1986).

R. Blahut, "Theory and Practice of Error Control Codes", Library of Congress Cataloging in Publication Data, pp. 47-49, (May 1984).

Saied Hemati, Amir H. Banihashemi, VLSI circuits: Iterative decoding in analog CMOS, Proceedings of the 13$^{th}$ ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

Wiberg, Niclas; Codes and Decoding on General Graphs; PhD dissertation No. 440; Dept. of Electrical Engineering; Linkoping University, Sweden; Oct. 30, 1996; pp. i-x, 1-96.

Weiss, Y.; Freeman, W.T.; On the optimality of solutions of the max-product belief-propagation algorithm in arbitrary graphs; Information Theory, IEEE Transactions on , vol. 47, Issue: 2, Feb. 2001; pp. 736-744.

Michael G. Luby, Michael Mitzenmacher, M. Amin Shokrollahi, Daniel A. Spielman, Volker Stemann; Practical loss-resilient codes; Proceedings of the twenty-ninth annual ACM symposium on Theory of computing; May 1997, pp. 150-159.

M. Luby, M. Mitzenmacher, A. Shokrollah, D. Spielman; Analysis of low density codes and improved designs using irregular graphs; Proceeding of the thirtieth annual ACM symposium on Theory of computing; May 1998; pp. 249-258.

Fossorier, M.P.C.; Mihaljevic, M.; Imai, H.; Reduced complexity iterative decoding of low-density parity check codes based on belief propagation; Communications, IEEE Transactions on, vol. 47, Issue: 5, May 1999; pp. 673-680.

Kurkoski, B.M.; Siegel, P.H.; Wolf, J.K.; Joint message-passing decoding of LDPC codes and partial-response channels; Information Theory, IEEE Transactions on , vol. 48, Issue: 6, Jun. 2002; pp. 1410-1422.

Al-Rawi G. et al: "A highly efficient domain-programmable parallel architecture for iterative LDPCC decoding", Proc. IEEE International Conference on Information Technology: Coding and Computing, Apr. 2-4, 2001 pp. 569-577 , XP002474759.

Boutillon et al., "Decoder-First Code Design," Proceeding Interantional Symposium on Turbo Codes and Related Topics, Sep. 2001, pp. 459-462, XP008011934.

Engling Y. et al.: "VLSI architectures for iterative decoders in magnetic recording channels", IEEE Transactions on Magnetics, IEEE Service Center, New York, NY US, vol. 37, No. 2, Mar. 2001, pp. 748-755.

Eric W. Weisstein. "Group Ring." From Math World—A Wolfram Web Resource, Dec. 30, 2004, p. 1 of 1.

Eric W. Weisstein et al. "Group Algebra." From Math World—A Wolfram Web Resource, Dec. 30, 2004, p. 1 of 2.

He Yu-Cheng et al: "Fast decoding of LDPC codes using quantisation", Electronics Letters, IEE Stevenage, GB, vol. 38, No. 4, Feb. 14, 2002, pp. 189-190, XP006017844.

International Search Report—PCT/US02/031971, International Search Authority—European Patent Office—Feb. 20, 2003.

Levine B. et al: "Implementaion of near Shannon ljmt error-correcting codes using reconfigurable hardware", Proc., IEEE Symp. on Field-Programmable Custom Computing Machines, Napa Valley, CA, USA, Apr. 17-19, 2000 pp. 217-226, XP010531940, pp. 223-224.

Mansour et al., "On the Architecture-Aware Structure of LDPC Codes from Generalized Ramanujan Graphs and their Decoder Architectures." 2003 Conference on Information Sciences and Systems, Mar. 2002.

Sorokine et al., "Gallagher Codes for CDMA Applications—Part II: Implementations, Complexity and System Capacity," IEEE Transactions on Communications, vol. 48, No. 11, Nov. 2000, pp. 1818-1828.

Supplementary European Search Report—EP02800936, International Search Authority—European Patent Office—Munich—May 7, 2008.

T. Richardson and R. Urbanke, "The Capacity of Low-Density Parity-Check Codes under Message-Passing . Decoding," Mar. 2001, pp. 1-44.

Tong Zhang et al: "On finite precision implementation of low density parity check codes decoder", ISCAS 2001. Proceedings of the 2001 IEEE International Symposium Onproc., IEEE Internat. Symp. on Circuits and Systems, Sydney, Australia, vol. vol. 1 of 5, May 6-9, 2001 pp. 202-205, XP010541828, pp. 203-204.

Yeo E. et al: "High throughput low-density parity-check decoder architectures", Proc., IEEE Global Telecommunications Conference., Globecom '01, San Antonio, TX, USA, vol. vol. 5 of 6, Nov. 25-29, 2001 pp. 3019-3024, XP010747547, p. 3020, figure 2.

Zhang et al., "VLSI Implementation-Oriented (3,k)- Regular Low-Density Parity Check Codes," SiPS 2001, Sep. 2001, pp. 25-36.

Al Rawl G. et al; "Optimng Iterative Decoding of Low-Density Panty Check Codes on Programmable Pipelined Parallel Architectures," Proc., IEEE Global Telecommunlcations Conf., Globecom 2001, Nov. 25-29, 2001. San Antonio, Tx, pp. 3012-3018, XP10747546.

* cited by examiner $$H = \begin{bmatrix} 1 & 1 & 1 & 1 & 0 & 1 & 1 & 0 & 0 & 0 \\ 0 & 0 & 1 & 1 & 1 & 0 & 1 & 1 & 0 & 1 \\ 0 & 1 & 0 & 1 & 0 & 1 & 0 & 1 & 1 & 1 \\ 1 & 0 & 1 & 0 & 1 & 1 & 0 & 1 & 1 & 0 \\ 1 & 1 & 0 & 0 & 1 & 0 & 1 & 0 & 1 & 1 \end{bmatrix} \quad X = \begin{bmatrix} X_1 \\ X_2 \\ X_3 \\ X_4 \\ X_5 \\ X_6 \\ X_7 \\ X_8 \\ X_9 \\ X_{10} \end{bmatrix}$$

202, 206

$$\begin{bmatrix} 1_1 & 1_4 & 1_7 & 1_{10} & 0 & 1_{16} & 1_{19} & 0 & 0 & 0 \\ 0 & 0 & 1_8 & 1_{11} & 1_{13} & 0 & 1_{20} & 1_{22} & 0 & 1_{28} \\ 0 & 1_5 & 0 & 1_{12} & 0 & 1_{17} & 0 & 1_{23} & 1_{25} & 1_{29} \\ 1_2 & 0 & 1_9 & 0 & 1_{14} & 1_{18} & 0 & 1_{24} & 1_{26} & 0 \\ 1_3 & 1_6 & 0 & 0 & 1_{15} & 0 & 1_{21} & 0 & 1_{27} & 1_{30} \end{bmatrix}$$

208

$$\begin{bmatrix} 1_1 & 1_2 & 1_3 & 1_4 & 0 & 1_5 & 1_6 & 0 & 0 & 0 \\ 0 & 0 & 1_7 & 1_8 & 1_9 & 0 & 1_{10} & 1_{11} & 0 & 1_{12} \\ 0 & 1_{13} & 0 & 1_{14} & 0 & 1_{15} & 0 & 1_{16} & 1_{17} & 1_{18} \\ 1_{19} & 0 & 1_{20} & 0 & 1_{21} & 1_{22} & 0 & 1_{23} & 1_{24} & 0 \\ 1_{25} & 1_{26} & 0 & 0 & 1_{27} & 0 & 1_{28} & 0 & 1_{29} & 1_{30} \end{bmatrix}$$

NODE PROCESSORS FOR USE IN PARITY CHECK DECODERS

RELATED APPLICATIONS

This application is a continuation of U.S. patent application Ser. No. 10/117,264 filed Apr. 4, 2002 now U.S. Pat. No. 6,938,196 which claims the benefit of U.S. Provisional Application Ser. No. 60/328,469 filed Oct. 10, 2001 and the benefit of U.S. Provisional Application Ser. No. 60/298,480 filed Jun. 15, 2001 and is a continuation-in-part of U.S. patent application Ser. No. 09/975,331 filed Oct. 10, 2001 now U.S. Pat. No. 6,633,856 each of which is hereby expressly incorporated by reference.

FIELD OF THE INVENTION

The present invention is directed to methods and apparatus for detecting and/or correcting errors in binary data, e.g., through the use of parity check codes such as low density parity check (LDPC) codes.

BACKGROUND

Error correcting codes are ubiquitous in communications and data storage systems. Recently a considerable interest has grown in a class of codes known as low-density parity-check (LDPC) codes.

LDPC codes are well represented by bipartite graphs, often called Tanner graphs, in which one set of nodes, the variable nodes, corresponds to bits of the codeword and the other set of nodes, the constraint nodes, sometimes called check nodes, correspond to the set of parity-check constraints which define the code. Edges in the graph connect variable nodes to constraint nodes. A variable node and a constraint node are said to be neighbors if they are connected by an edge in the graph. For simplicity, we generally assume that a pair of nodes is connected by at most one edge. To each variable node is associated one bit of the codeword. In some cases some of these bits might be punctured, i.e., removed from the codeword. For simplicity we shall generally assume that no puncturing is used.

A bit sequence associated one-to-one with the variable node sequence is a codeword of the code if and only if, for each constraint node, the bits neighboring the constraint (via their association with variable nodes) sum to zero modulo two, i.e., they comprise an even number of ones.

The decoders and decoding algorithms used to decode LDPC codewords operate by exchanging messages within the graph along the edges and updating these messages by performing computations at the nodes based on the incoming messages. Such algorithms will be generally referred to as message passing algorithms. Each variable node in the graph is initially provided with a soft bit, termed a received value, that indicates an estimate of the associated bit's value as determined by observations from, e.g., the communications channel. Ideally, the estimates for separate bits are statistically independent. This ideal can be, and often is, violated in practice. A collection of received values constitutes a received word. For purposes of this application we may identify the signal observed by, e.g., the receiver in a communications system, with the received word.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These codes were originally invented by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

In order to more precisely describe the decoding process we introduce the notion of a socket in describing LDPC graphs. A socket can be interpreted as an association of an edge in the graph to a node in the graph. Each node has one socket for each edge attached to it and the edges are "plugged into" the sockets. Thus, a node of degree d has d sockets attached to it. If the graph has L edges then there are L sockets on the variable node side of the graph, called the variable sockets, and L sockets on the constraint node side of the graph, called the constraint sockets. For identification and ordering purposes, the variable sockets may be enumerated $1, \ldots, L$ so that variable sockets attached to one variable node appear contiguously. In such a case, if the first three variable nodes have degrees $d_1$, $d_2$, and $d_3$ respectively, then variable sockets $1, \ldots, d_1$ are attached to the first variable node, variable sockets $d_1+1, \ldots, d_1+d_2$ are attached to the second variable node, and variable sockets $d_1+d_2+1, \ldots, d_1+d_2+d_3$ are attached to the third variable node. Constraint node sockets may be enumerated similarly $1, \ldots, L$ with constraint sockets attached to one constraint node appearing contiguously. An edge can be viewed as a pairing of sockets, one of each pair coming from each side of the graph. Thus, the edges of the graph represent an interleaver or permutation on the sockets from one side of the graph, e.g., the variable node side, to the other, e.g., the constraint node side. The permutations associated with these systems are often complex.

An exemplary bipartite graph 100 determining a (3,6) regular LDPC code of length ten and rate one-half is shown in FIG. 1. Length ten indicates that there are ten variable nodes $V_1$-$V_{10}$, each identified with one bit of the codeword $X_1$-$X_{10}$ (and no puncturing in this case), generally identified by reference numeral 102. Rate one half indicates that there are half as many check nodes as variable nodes, i.e., there are five check nodes $C_1$-$C_5$ identified by reference numeral 106. Rate one half further indicates that the five constraints are linearly independent, as discussed below. Each of the lines 104 represents an edge, e.g., a communication path or connection, between the check nodes and variable nodes to which the line is connected. Each edge identifies two sockets, one variable socket and one constraint socket. Edges can be enumerated according to their variable sockets or their constraint sockets. The variable sockets enumeration corresponds to the edge ordering (top to bottom) as it appears on the variable node side at the point where they are connected to the variable nodes. The constraint sockets enumeration corresponds to the edge ordering (top to bottom) as it appears on the constraint node side at the point they are connected to the constraint nodes. During decoding, messages are passed in both directions along the edges. Thus, as part of the decoding process messages are passed along an edge from a constraint node to a variable node and vice versa.

An alternative to using a graph to represent codes is to use a matrix representation such as that shown in FIG. 2. In the matrix representation of a code, the matrix H 202, commonly referred to as the parity check matrix, includes the relevant edge connection, variable node and constraint node information. For simplicity we assume that at most one edge connects any pair of nodes. In the matrix H, each column corresponds to one of the variable nodes while each row corresponds to one of the constraint nodes. Since there are 10 variable nodes and 5 constraint nodes in the exemplary code, the matrix H includes 10 columns and 5 rows. The entry of the matrix corresponding to a particular variable node and a particular constraint node is set to 1 if an edge is present in the graph, i.e., if the two nodes are neighbors, otherwise it is set to 0. For example, since variable node $V_1$ is connected to constraint node $C_1$ by an edge, a one is located in the uppermost left-hand corner of the matrix 202. However, variable node $V_4$ is not connected to constraint node $C_1$ so a 0 is positioned in the fourth position of the first row of matrix 202 indicating that the corresponding variable and constraint nodes are not connected. We say that the constraints are linearly independent if the rows of H are linearly independent vectors over GF[2]. Enumerating edges by sockets, variable or constraint, corresponds to enumerating the 1's in H. Variable socket enumeration corresponds to enumerating top to bottom within columns and proceeding left to right from column to column, as shown in matrix 208. Constraint socket enumeration corresponds to enumerating left to right across rows and proceeding top to bottom from row to row, as shown in matrix 210.

In the case of a matrix representation, the codeword X which is to be transmitted can be represented as a vector 206 which includes the bits $X_1$-$X_n$ of the codeword to be processed. A bit sequence $X_1$-$X_n$ is a codeword if and only if the product of the matrix 206 and 202 is equal to zero, that is: Hx=0.

In the context of discussing codewords associated to LDPC graphs, it should be appreciated that in some cases the codeword may be punctured. Puncturing is the act of removing bits from a codeword to yield, in effect, a shorter codeword. In the case of LDPC graphs this means that some of the variable nodes in the graph correspond to bits that are not actually transmitted. These variable nodes and the bits associated with them are often referred to as state variables. When puncturing is used, the decoder can be used to reconstruct the portion of the codeword which is not physically communicated over a communications channel. Where a punctured codeword is transmitted the receiving device may initially populate the missing received word values (bits) with ones or zeros assigned, e.g., in an arbitrary fashion, together with an indication (soft bit) that these values are completely unreliable, i.e., that these values are erased. For simplicity, we shall assume that, when used, these receiver-populated values are part of the received word which is to be processed.

Consider for example the system 350 shown in FIG. 3. The system 350 includes an encoder 352, a decoder 357 and a communication channel 356. The encoder 350 includes an encoding circuit 353 that processes the input data A to produce a codeword X. The codeword X includes, for the purposes of error detection and/or correction, some redundancy. The codeword X may be transmitted over the communications channel. Alternatively, the codeword X can be divided via a data selection device 354 into first and second portions X', X" respectively by some data selection technique. One of the codeword portions, e.g., the first portion X', may then be transmitted over the communications channel to a receiver including decoder 357 while the second portion X" is punctured. As a result of distortions produced by the communications channel 356, portions of the transmitted codeword may be lost or corrupted. From the decoder's perspective, punctured bits may be interpreted as lost.

At the receiver soft bits are inserted into the received word to take the place of lost or punctured bits. The inserted soft bits indicate erasure of X" bits and/or bits lost in transmission.

The decoder 357 will attempt to reconstruct the full codeword X from the received word Y and any inserted soft bits, and then perform a data decoding operation to produce A from the reconstructed codeword X.

The decoder 357 includes a channel decoder 358, e.g., an LDPC decoder, for reconstructing the complete codeword X from the received word Y and any inserted soft bits. In addition it includes a data decoder 359 for removing the redundant information included in the codeword to produce the original input data A from the reconstructed codeword X.

It will be appreciated that received words generated in conjunction with LDPC coding, can be processed by performing LDPC decoding operations thereon, e.g., error correction and detection operations, to generate a reconstructed version of the original codeword. The reconstructed codeword can then be subject to data decoding to recover the original data that was coded. The data decoding process may be, e.g., simply selecting a specific subset of the bits from the reconstructed codeword.

As mentioned above, LDPC decoding operations generally comprise message passing algorithms. There are many potentially useful message passing algorithms and the use of such algorithms is not limited to LDPC decoding. As will be discussed in detail below, the current invention is directed to methods and apparatus which provide a simple, e.g., low hardware complexity, implementation of a decoder algorithm that gives very good and often near optimal performance in many circumstances. The proposed algorithm can be viewed as an approximation of the well-known belief propagation algorithm.

To facilitate understanding of the invention discussed in the sections which follow, we will now give a brief mathematical description of belief propagation.

Belief propagation for (binary) LDPC codes can be expressed as follows. Messages transmitted along the edges of the graph are interpreted as log-likelihoods $$\log \frac{p_0}{p_1}$$

for the bit associated to the variable node. Here, $(p_0, p_1)$ represents a conditional probability distribution on the associated bit where $p_x$ denotes the probability that the bit takes the value x. The soft bits provided to the decoder by the receiver are also given in the form of a log-likelihood. Thus, the received values, i.e., the elements of the received word, are log-likelihoods of the associated bits conditioned on the observation of the bits provided by the communication channel. In general, a message m represents the log-likelihood m and a received value y represents the log-likelihood y. For punctured bits the log-likelihood received value y is set to 0, indicating $$p_0 = p_1 = 1/2.$$

Let us consider the message-passing rules of belief propagation. Messages are denoted by $m^{C2V}$ for messages from check nodes to variable nodes and by $m^{V2C}$ for messages from variable nodes to check nodes. Consider a variable node with d edges. For each edge j=1, ..., d let $m^{C2V}(i)$ denote the incoming message on edge i. At the initialization of the decoding process we set $m^{C2V}=0$ for every edge. In general, outgoing messages from variable nodes are given by $$m^{V2C}(j) = y + \left(\sum_{i=1}^{d} m^{C2V}(i)\right) - m^{C2V}(j).$$

The outgoing decoded soft value from a node (not an edge message) corresponding to this operation is given by $$x_{out} = y + \left(\sum_{i=1}^{d} m^{C2V}(i)\right).$$

The outgoing hard decision associated to this output is obtained from the sign of $X_{out}$.

At the check nodes it is often more convenient to represent the messages using their 'sign' and magnitudes. Thus, for a message m let $m_p \in GF[2]$ denote the 'parity' of the message, i.e., $m_p=0$ if $m \geq 0$ and $m_p=1$ if $m<0$. Additionally let $m_r \in [0,\infty]$ denote the magnitude of m. Thus, we have $m=-1^{m_p}m_r$. At the check node the updates for $m_p$ and $m_r$ are separate. We have, for a check node of degree d, $$m_p^{C2V}(j) = \left(\sum_{i=1}^{d} m_p^{V2C}(i)\right) - m_p^{V2C}(j),$$

where all addition is over GF[2], and $$m_r^{C2V}(j) = F^{-1}\left(\left(\sum_{i=1}^{d} F(m_r^{V2C}(i))\right) - F(m_r^{V2C}(j))\right)$$

where we define $F(x):=\ln \coth (x/2)$. In both of the above equations the superscript V2C denotes the incoming messages at the constraint node. We note that F is its own inverse, i.e., $F^{-1}(x)=F(x)$.

BRIEF DESCRIPTION OF THE FIGURES

FIG. 2 is a matrix representation of the code graphically illustrated in FIG. 1.

SUMMARY OF THE INVENTION

Figure 1:
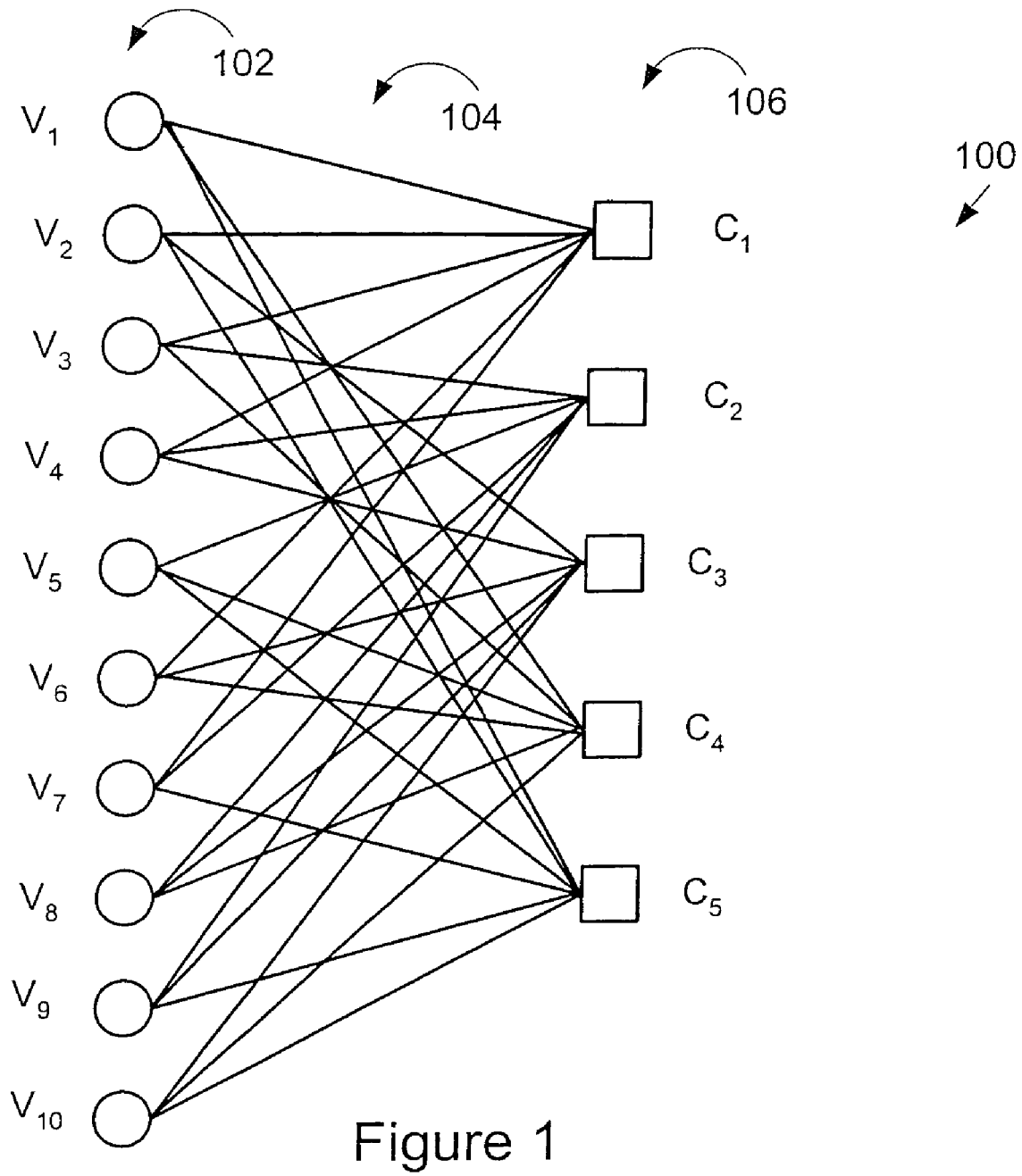
FIG. 1 illustrates a bipartite graph representation of an exemplary regular LDPC code of length ten.
Figure 3:
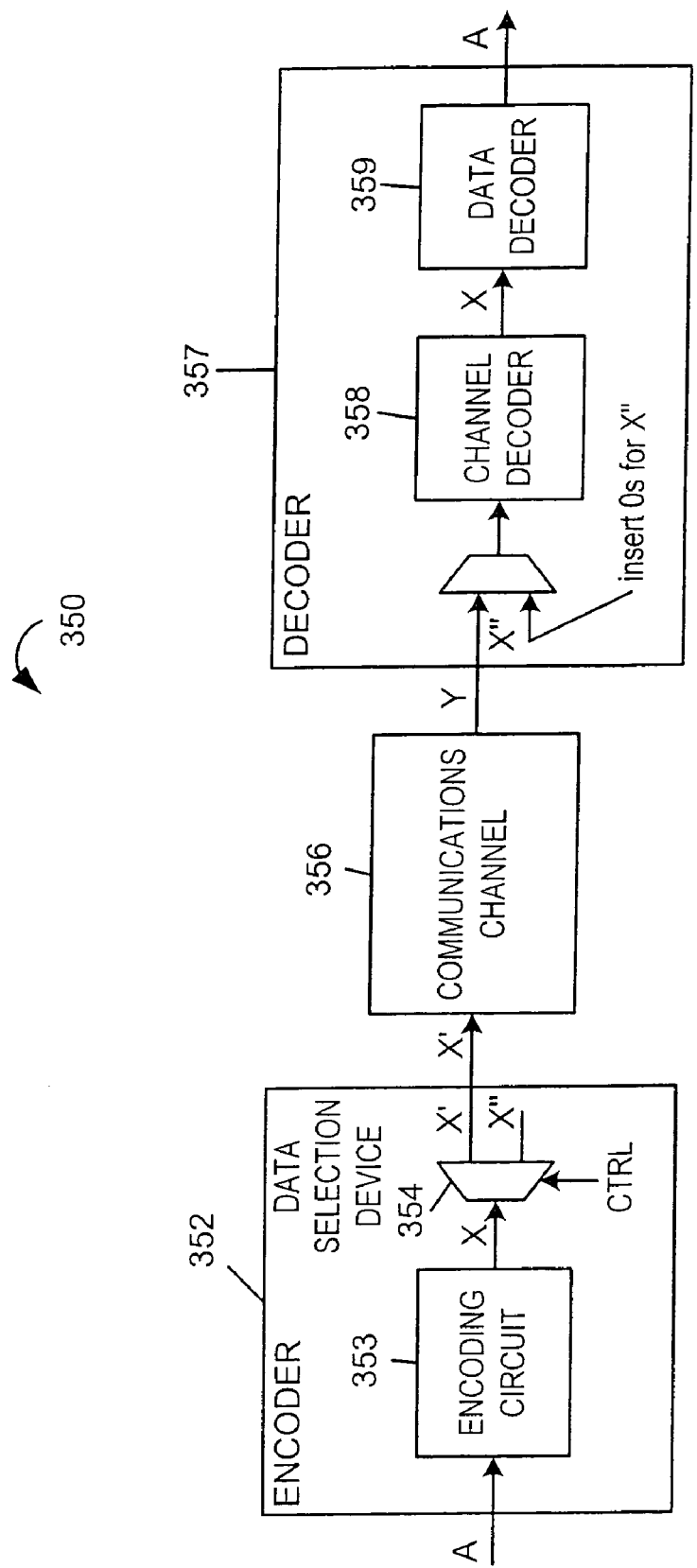
FIG. 3 illustrates coding, transmission, and decoding of data.

The present invention is directed to methods and apparatus for performing decoding operations that are used in conjunction with message passing decoding techniques. The techniques of the present invention are particularly well suited for use with LDPC codes.

In the background material of this application we provided a mathematical description of the belief propagation algorithm which can be used in conjunction with LDPC decoding. It is evident, according to our description, that the main difficulty encountered in implementing the algorithm concerns the function F and its inverse. Other required operations tend to be relatively simple to implement.

To facilitate hardware implementation of an LDPC decoder, in some embodiments of the invention, log-likelihood values are quantized to integer multiples of ½ ln 2. Log-likelihood values may be, for example, log likelihood ratios or approximations thereof.

Log likelihood ratios may be explained as follows. Let x be a bit. Assume that x, possibly together with other bits, are transmitted as a signal and that the receiver observes z as a consequence. The log likelihood ratio for x is defined as $$y = \log \frac{p(z|x=0)}{p(z|x=1)}$$

where $p(z|x=i)$ denotes the conditional probability of observing z given the condition x=i. There are many possible methods and forms for computing y depending on the signaling scheme, the channel model, etc. Assuming that the two possibilities for x are a priori equally likely, the likelihood ratio $$\frac{p(z|x=0)}{p(z|x=1)}$$

is equal to the ratio of the posterior probabilities of x given z, i.e., $$\frac{p(x=0|z)}{p(x=1|z)}.$$

Thus, we often denote the log likelihood ratio as simply $$y = \log \frac{p_0}{p_1}$$

where $p_i$ denotes a conditional probability that x=i. During various LDPC decoding embodiments of the invention we compute, at least approximately, such log likelihood ratios (e.g. the messages) where the conditioning information is increasing with each iteration.

In a practical digital message passing decoder implementation, the decoder messages are represented by a finite number of bits. In anticipation of the use of quantization in accordance with the invention, we introduce a scaling parameter δ. In the described exemplary implementations of the invention, messages are integers m and the interpretation of the message is that it represents the log-likelihood mδ. Thus, in the exemplary embodiments our messages are integers which, when scaled by δ in accordance with the invention determine the associated log-likelihoods.

In accordance with the invention, we approximate the function F described in the background section of this application by replacing it with another function that better lends itself to implementation. In various embodiments we slightly modify the initial approximation we discuss, along with its inverse, so that the resulting decoder performs closer to a true belief propagation decoder.

The idea of the approximation can be understood by expanding F(δx) in a series in $e^{-\delta x}$ as follows.

$$F(\delta x) = \ln(\coth(\delta x/2))$$
$$= \ln(1 + e^{-\delta x}) - \ln(1 - e^{-\delta x})$$
$$= \sum_{k=1}^{\infty} \frac{2}{2k-1} e^{-k\delta x}.$$

Thus, for large values of δx the function $\ln(\coth(\delta x/2))$ can be well approximated by $2e^{-\delta x}$. Bearing in mind that our goal is to find a low-complexity implementation, the approximation of the function F(x) by $2e^{-\delta x}$ is quite attractive. If we simply replace F(x) with $2e^{-\delta x}$ then the magnitude portion of the check node update takes the form $$m_r^{C2V}(j) = -\left[\delta^{-1}\ln\left(\left(\sum_{i=1}^{d} e^{-\delta m_r^{V2C}(i)}\right) - e^{-\delta m_r^{V2C}(j)}\right)\right],$$

where [x] denotes the integer part of x.

Note that if we choose δ=ln2 then the computation required for the check node reliability update is particularly simple, allowing for an implementation using addition and shift operations. It turns out, for code rates above roughly ⅕, that setting δ=ln2 provides sufficient resolution to achieve nearly full belief propagation performance. For lower rates this quantization is too coarse and setting δ=½ ln2 can be preferable. The main advantage of choosing δ in this way is that it greatly simplifies calculation of the ln operation.

Consider the case where δ=ln2. In this case the constraint node update computations take the form $$m_r^{C2V}(j) = -\left[\log_2\left(\left(\sum_{i=1}^{d} 2^{-m_r^{V2C}(i)}\right) - 2^{-m_r^{V2C}(j)}\right)\right].$$

Since it is the integer part of the $\log_2$ function that we use, the function can be implemented as a priority encoder, that is, one can implement the function by simply determining the location of the first 1 exemplary bipartite in the binary representation of the argument.

The approximation of $\ln(\coth(\delta x/2))$ by $2e^{-\delta x}$ can result in relatively large errors in the case of small values of δx. One can compensate somewhat for the error with a mild adjustment of the forward and inverse functions. More specifically, small offsets can be, and in various embodiments of the invention are, applied during the constraint node update. Doing this, the update computations of the take the form $$m^{V2C}(j) = r + \left(\sum_{i=1}^{d} m^{C2V}(i)\right) - m^{C2V}(j),$$

at the variable nodes, and take the form $$m_r^{C2V}(j) = C_2 - (\text{Priority})\log_2\left(\left(\sum_{i=1}^{d} 2^{C_1 - m_r^{V2C}(i)}\right) - 2^{C_1 - m_r^{V2C}(j)}\right)$$

at the check nodes, where $C_1$ and $C_2$ are constants and "Priority" refers to the operation of finding the first '1' in a suitable binary representation of the argument. We will elaborate more on the meaning and exemplary implementations of the priority encoder in the detailed description which follows.

We turn now to hardware considerations. Note that, ignoring the transformations for the moment, the dominant computation for message updates has the simplified form:

$$m_{out}(j) = \sum_{i=1}^{d} m_{in}(i) - m_{in}(j).$$

We propose to perform the message passing operations serially in time. Incoming messages arrive, e.g., one per clock cycle. It is therefore desirable to have an efficient pipeline structure that can produce one outgoing edge message per clock cycle. The present invention also includes a description of a particular structure, a node processor, to implement the above computational rule in this manner. The particular implementation provides for an efficient streamlined computation of message passing operations.

DETAILED DESCRIPTION OF THE INVENTION

As discussed above, the decoding methods and apparatus of the present invention will be described, for purposes of explanation, in the context of an LDPC decoder embodiment. Steps involved in decoding of an LDPC code will first be described with reference to FIGS. 4 and 5 followed by a more detailed discussion of the present invention.

Figure 4:
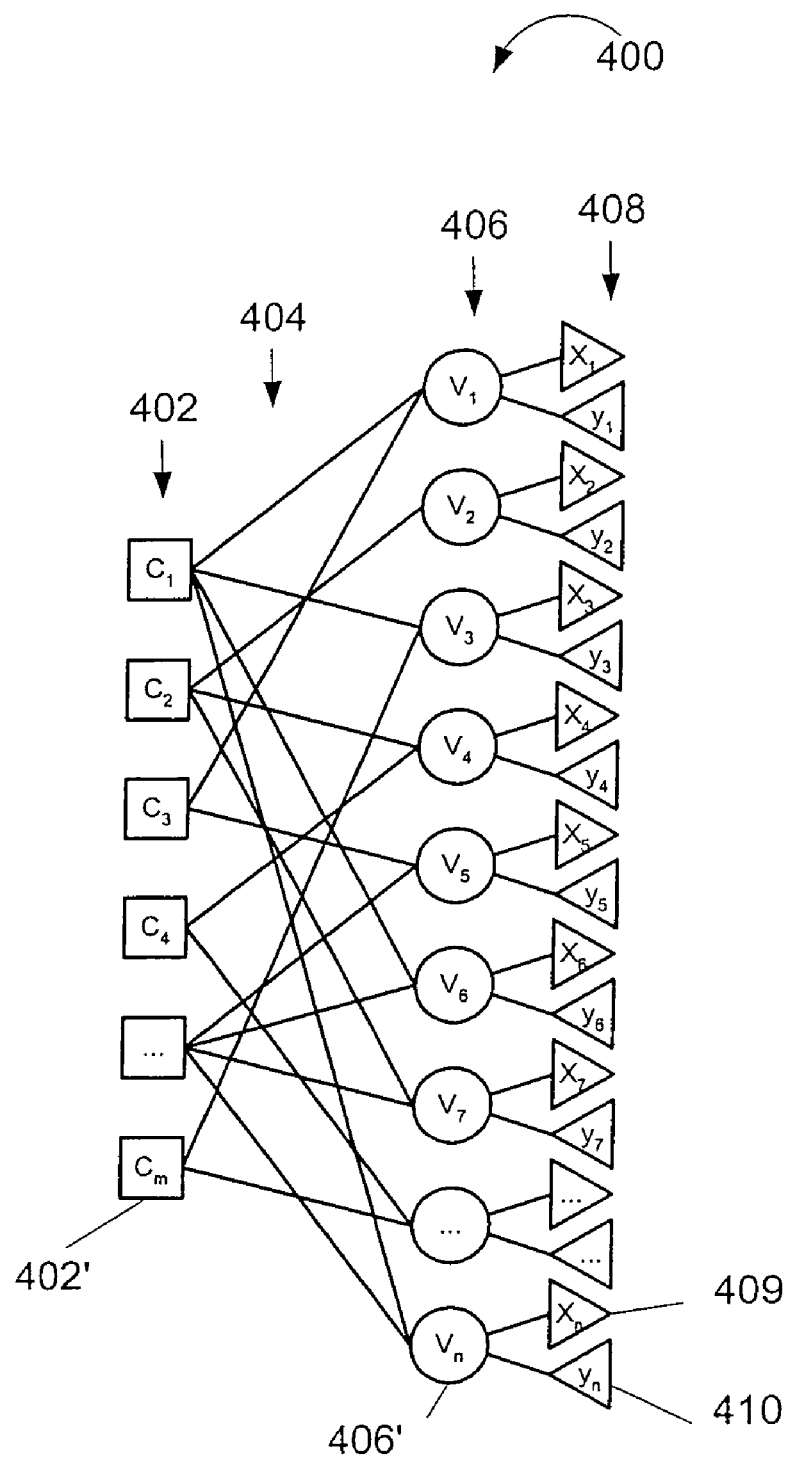
FIG. 4 is a bipartite graph representation of an exemplary irregular LDPC code.

FIG. 4 illustrates an exemplary irregular LDPC code using a bipartite graph 400. The graph includes m check nodes 402, n variable nodes 406, and a plurality of edges 404. Messages between the check nodes and variable nodes are exchanged over the edges 404. Soft input bits $y_l$ through $y_n$, corresponding to the received word Y, and soft (or hard) outputs $x_j$ through $x_n$ are indicted by reference numeral 408. The $m^{th}$ check node is identified using reference numeral 402', the $n^{th}$ variable node is identified using reference numeral 406' while the $n^{th}$ soft input $y_n$ and the nth soft output $x_n$ are indicated in FIG. 4 using reference numbers 410, 409 respectively Variable nodes 406 process messages from the constraint nodes 402 together with the input soft values from the received word $y_1, \ldots, y_n$ to update the value of the output variables $x_1, \ldots, x_n$ corresponding to the variable nodes and to generate messages for the constraint nodes. One message is generated by a variable node for each edge connected to it. The generated message is transmitted along the edge from the variable node to the constraint node attached to the edge. For purposes of explanation, messages from variable nodes to constraint nodes will, from time to time in the present application, be indicated by using the abbreviation V2C while messages from constraint nodes to variable nodes will be indicated by using the abbreviation C2V. Indices may be added to the V and C components of this abbreviation to indicate the particular one of the variable nodes and constraint nodes which serves as the source/destination of a particular message. Each constraint node 402 is responsible for processing the messages received from the variable nodes via the edges. The V2C messages received from the variable nodes are processed by the constraint nodes 402 to generate C2V messages which are then transmitted back along the edges attached to each constraint node. The variable nodes 406 then process the C2V messages, together with the soft input values, to generate and transmit new V2C messages, and generate soft outputs, $x_i$. The sequence of performing processing at the variable nodes 406 comprising: transmitting generated messages to the check nodes 402, generating at the variable nodes soft outputs $x_i$, and receiving messages from the check nodes, may be performed repeatedly, i.e., iteratively, until the outputs $x_i$ from the variable nodes 406 indicate that the codeword has been successfully decoded or some other stopping criterion, e.g., completion of a fixed number of message passing iterations, has been satisfied. It should be appreciated that the sequence of operations described above need not occur strictly in the order described. Node processing may proceed asynchronously and variable and constraint node processing may occur simultaneously. Nevertheless, the logic of the iterative process is as described.

Messages, V2C and C2V, may be one or more bits, e.g., K bits each, where K is a positive non-zero integer value. Similarly, the soft outputs $x_i$ may be one or more bits. Multiple bit messages and outputs provide the opportunity to relay confidence or reliability information in the message or output. In the case of a multi-bit (soft) output, the sign of the soft output value may be used to provide the single bit hard output of the decoding process corresponding to a variable node, e.g., the bits of the decoded codeword. Output soft values may correspond to decoded soft values or, alternatively, to so-called extrinsic information (excluding the corresponding input information) which may be used in another larger iterative process within which the LDPC decoder is but one module.

The iterative message passing process associated with decoding an LDPC code will now be discussed further with reference to FIGS. 5a through 5d.

When decoding an LDPC code, the processing at each constraint and variable node may be performed independently. Accordingly, variable and/or constraint node processing may be performed one node at time, e.g., in sequence, until some or all of the variable and constraint node processing has been completed for a particular iteration of the decoding process. This allows a single unit of processing hardware to be provided and reused, if desired, to perform the processing associated with each of the variable and/or constraint nodes. Another significant feature of LDPC decoding is that the V2C and C2V messages used during a particular processing iteration need not have been generated at the same time, e.g., during the same processing iteration. This allows for implementations where constraint and variable node processing can be performed asynchronously and in parallel without regard to the time delay since the utilized messages were last updated. Following a sufficient number of message updates and iterations wherein all the variable and constraint nodes process the received messages and generate updated messages, the (hard) output of the variable nodes will converge, assuming that the graph was properly designed and there are no remaining uncorrected errors in the received word being processed.

Given that the processing at each check node and variable node can be viewed as an independent operation, the iterative processing performed at a single exemplary check node $C_N$ 502' and variable node $V_n$ 506' will now be discussed in more detail with reference to FIGS. 5a-5d. For purposes of description we will assume a quantized belief propagation algorithm. Received values and messages are therefore real numbers. A positive number corresponds to a hard bit decision of 0 and a negative number corresponds to a hard bit decision of 1. Larger magnitudes indicate larger reliability. Thus, the number zero indicates absolute unreliability and the sign (positive or negative) is irrelevant. Details of the computations performed in the algorithm are described in the preceding section.

Figure 5A:
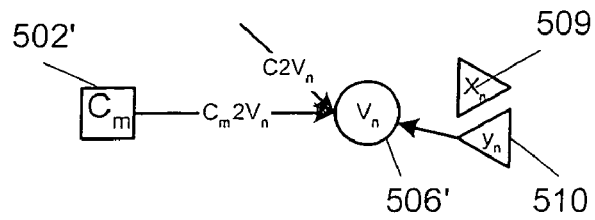
FIG. 5, which comprises the combination of FIGS. 5a through 5d, illustrates steps performed as part of an LDPC decoding operation in accordance with the LDPC code illustrated in FIG. 4.

FIG. 5a illustrates the initial step in an LDPC decoding process. Initially, the variable node $V_n$ 506' is supplied with the soft input, e.g., the received values (1 or more bits representing a log-likelihood) $y_n$ from a received word to be processed. The C2V messages at the start of a decoding operation and the soft output $X_n$ 509 are initially set to zero. Based on the received inputs, e.g., the zero value C2V messages and input $y_n$, the variable node $V_n$ 506' generates one V2C message for each check node to which it is connected. Typically, in the initial step, each of these messages will be equal to $y_n$.

Figure 5B:
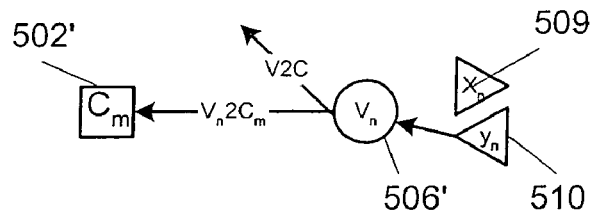
Figure 5C:
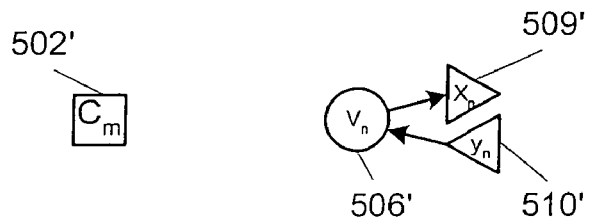

In FIG. 5b generated V2C messages are shown being transmitted along each of the edges connected to variable node $V_n$ 506'. Thus, updated V2C messages are transmitted to each of the check nodes 502 coupled to variable node $V_n$ 506' including check node $C_m$ 502'.

In addition to generating the V2C messages, variable node processing results in the updating of the soft output $X_n$ 509' corresponding to the variable node doing the processing. The soft output $X_n$ is shown being updated in FIG. 5c. While shown as different steps, the soft output may be output at the same time the V2C messages are output.

As will be discussed further below, in accordance with some embodiments of the present invention, the soft outputs (or their associated hard decisions) may be used to determine when a codeword has been recovered from the received word, i.e., when the parity constraints have been satisfied by the output values. This indicates successful decoding (although the codeword found may be incorrect, i.e., not the one that was transmitted) thereby allowing the iterative decoding process to be halted in a timely fashion, e.g., before some fixed maximum allowed number of message passing iterations is completed.

Check node processing can be performed once a check node, e.g., check node $C_m$ 502', receives V2C messages along the edges to which it is connected. The received V2C messages are processed in the check node to generate updated C2V messages, one for each edge connected to the particular check node. As a result of check node processing, the C2V message transmitted back to a variable node along an edge will depend on the value of each of the V2C messages received on the other edges connected to the check node but (usually and preferably) not upon the V2C message received from the particular variable node to which the C2V message is being transmitted. Thus, C2V messages are used to transmit information generated from messages received from variable nodes other than the node to which the message is being transmitted.

Figure 5D:
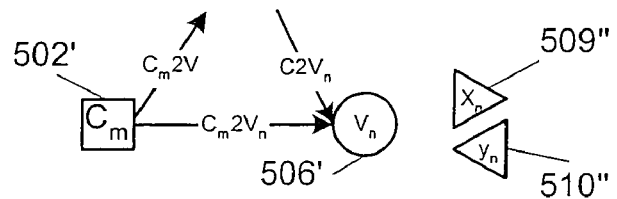

FIG. 5d illustrates the passage of updated C2V messages to variable nodes including node 506'. In particular, in FIG. 5d constraint node $C_m$ 502' is shown outputting two updated C2V messages with the updated $C_m2V_n$ message being supplied to variable node $V_n$ 506'. $V_n$ 506' also receives additional updated $C2V_n$ message(s) from another constraint node(s) to which it is connected.

With the receipt of updated C2V messages, variable node processing can be repeated to generate updated V2C messages and soft outputs. Then the updating of C2V messages can be further repeated and so on until the decoder stopping criterion is satisfied.

Thus, the processing shown in FIGS. 5a-5d will be repeated after the first iteration, using updated message values as opposed to initial values, until the decoding process is stopped.

The present invention concerns the form of messages passed, the computation performed thereon, and hardware structures that perform these computations. To place the invention in context we shall briefly describe an LDPC decoder implementation. This implementation is for illustrative purposes. Efficient implementation architectures are discussed in U.S. patent application Ser. No. 09/975,333 filed Oct. 10, 2001 titled: "Methods and Apparatus for Decoding LDPC codes" which is hereby expressly incorporated by reference.

In accordance with one feature of the present invention, message passing decoding input values y are in the form of log-likelihood values which are quantized to be integer multiples of ½ ln 2. The generation of quantized log-likelihood values may involve processing received values to generate therefrom log-likelihood values, e.g., ratios, or approximations thereof. The log-likelihood values are then quantized using step sizes which are integer ratios of ½ ln 2 to produce the quantized log-likelihood values. The log-likelihood values are, in various embodiments, log-likelihood ratios or approximations thereof. The use of such quantized log-likelihood ratios facilitates decoder implementation.

Figure 6:
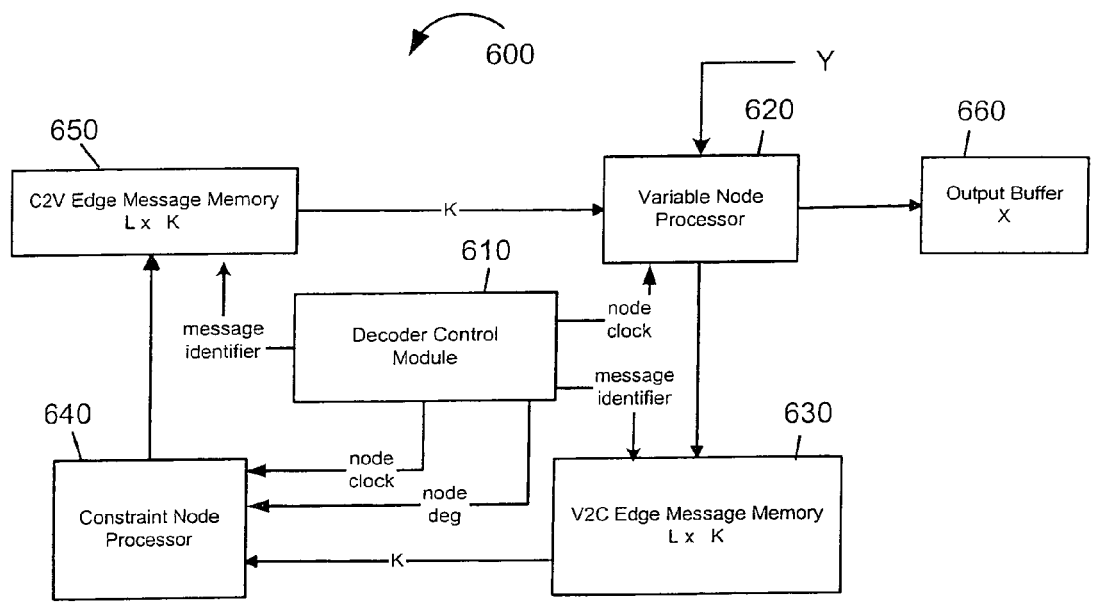
FIG. 6 illustrates a serial LDPC decoder including node processors implemented in accordance with the present invention.

Circuitry for generating quantized log-likelihood values, e.g., ratios, from received values may be incorporated directly into a receiver which forms part of the communications channel 356 that precedes the message passing decoder of the present invention, e.g., decoder 600 shown in FIG. 6.

Figure 15:
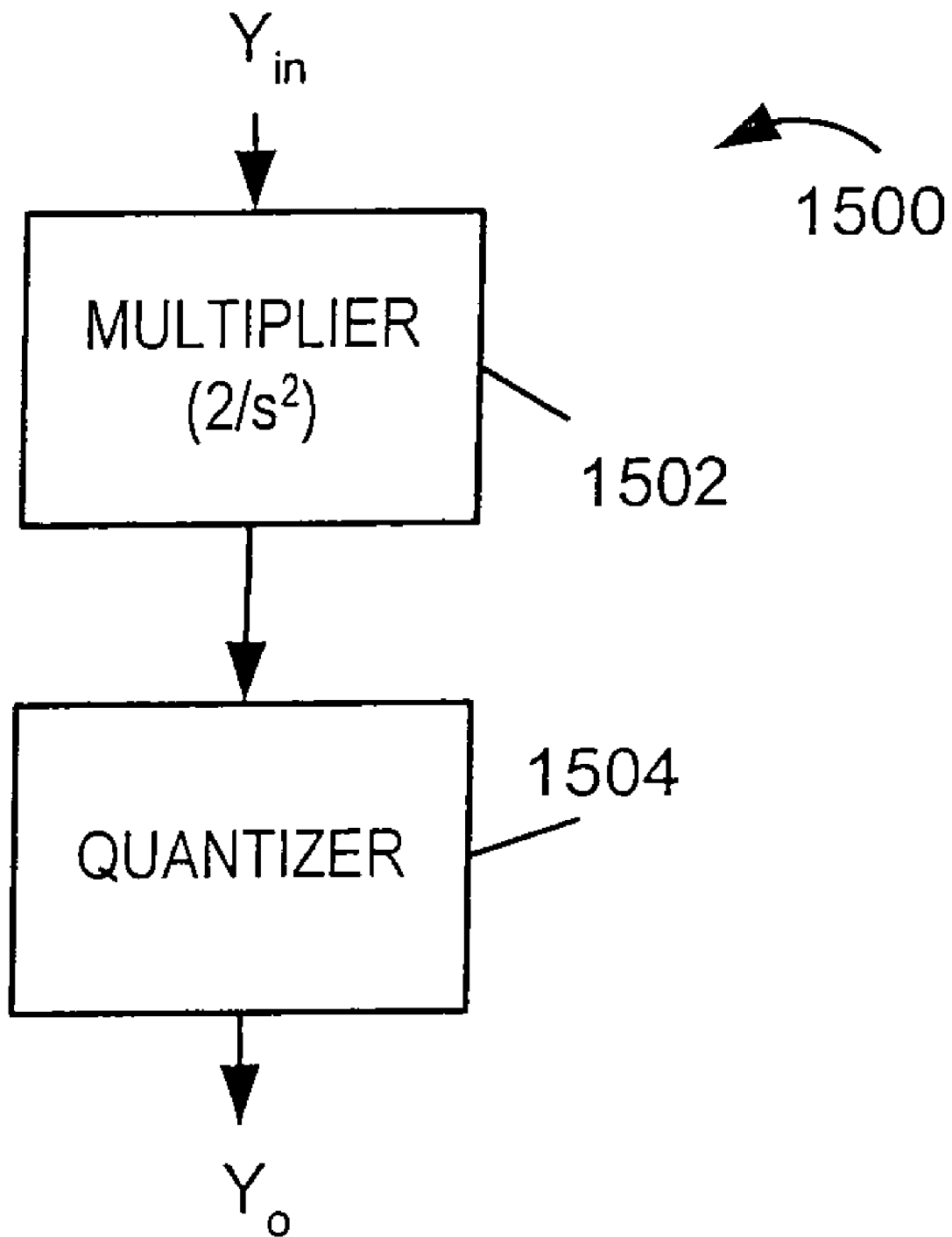
FIG. 15 illustrates and apparatus which can be used for generating quantized log likelihood values from values detected by a receiver.

Various circuits may be used to generate quantized log-likelihood ratios in accordance with the invention. Referring now briefly to FIG. 15, an exemplary circuit 1500 for generating a quantized log-likelihood ratio $y_o$, from a received value $y_{in}$, is shown. The FIG. 15 circuit is suitable in cases of BPSK (+1,−1) signaling with additive Gaussian noise, where it may be assumed that each received value is proportional to the log-likelihood ratio for the associated bit. In such a case, the received value may be converted to a log-likelihood ratio by simply multiplying by a constant.

The value $y_{in}$ may be a value received by a receiver circuit which is processed to produce the log-likelihood ratio $y_o$ supplied by a message passing decoder of the present invention. The circuit 1500 includes a multiplier 1502 for generating log-likelihood ratios by multiplying the input value $Y_{in}$ by $(2/s^2)$ where $s^2$ is a constant corresponding to the additive Gaussian noise introduced by the communications channel into the received signal. The resulting log-likelihood ratio is then quantized by quantizer 1504 to be an integer multiple of ½ ln 2. Quantizer 1504 may be implemented by dividing the log-likelihood ratio generated by multiplier 1502 by ½ ln 2 and then saturating the result to +15 or −15 when the magnitude exceeds 15 and otherwise taking the 5 lsbs (least significant bits) of the resulting value as the quantized log-likelihood ratio $Y_o$ which may then be supplied as an input to decoder circuit 600.

FIG. 6 depicts a simple serial decoder 600 which performs message processing operations sequentially, one edge at a time. The LDPC decoder 600 comprises a decoder control module 610, a V2C edge memory 630, a C2V edge memory 650, a variable node processor 620, a constraint node processor 640, and output buffer 660. For simplicity, with regard to explaining the invention, we will assume that the decoder runs for a fixed number of iterations, i.e., no convergence detection is performed.

V2C and C2V edge memories 630, 650 each include L K bit memory locations with each K bit location corresponding to one edge and where L is the total number of edges in the LDPC graph being used and K is the number of bits per message exchanged along an edge. The output buffer 660 includes memory for storing variable node output values x, which may be either hard (1 bit) or soft (more than 1 bit) values.

The decoder control module 610 includes information describing the graph in stored form. It uses this information to control the message passing as described below. Each received value and message is assumed to be comprised of K bits. The decoder operates serially. It first performs variable node update operations and then constraint node update operations. It repeats this cycle some fixed number of times concluding after a final variable node update. Initially the C2V message memory is populated with zeroes. (Note that variable node processing and constraint node processing may be physically concurrent in time. The ordering described above indicates the flow of information during the processing.)

We will now describe a variable node update. The decoder control module 610 causes the C2V messages to be read out of the C2V message memory in variable node socket order and to be delivered to the variable node processor 620. The decoder control module 610 signals to the C2V edge message memory 650 a message identifier (e.g., memory location or pointer) indicating which message is to be read out at that point in time. Referring to FIG. 1, for example, the first three messages delivered to the variable node processor 620 would be those incoming to variable node $v_1$. The next three messages delivered to the variable node processor 620 would be those incoming to variable node $v_2$, and so on.

Messages for a given node are processed by the variable node processor 620. The variable node processor 620 receives from the decoder control module 610 a signal, the node clock signal, that indicates node boundaries. This signal informs the variable node processor, in effect, about the degree of the node currently being processed. The signal can, and in various embodiments is, sent, e.g., at the point in time coincident with the arrival of the last incoming messages corresponding to a particular node.

Node update computations are performed in the variable node processor 620. Outgoing V2C messages are emitted in variable socket order, i.e., corresponding to the edge order of the incoming messages, and these messages are stored in V2C edge message memory 630. Soft or hard output values are stored in the output buffer 660. Upon completion of the variable node update, unless it is the last update, the decoder proceeds to performing a constraint node update.

We will now describe a constraint node update. It is very similar to a variable node update and we will be brief. The decoder control module 610 causes the V2C messages to be read out of the V2C message memory 630 in constraint socket order and to be delivered to the constraint node processor 640. The decoder control module 610 signals to the V2C edge message memory 630 a message identifier (e.g., memory location) indicating which message is to be read out. Messages for a given constraint node are processed by the constraint node processor 640. The constraint node processor 640 receives a signal, the node clock signal, from the decoder control module 610 that indicates node boundaries. Outgoing C2V messages are emitted in constraint socket order, i.e., corresponding to the edge order of the incoming messages, and these messages are stored in C2V edge message memory 650.

Together the variable node update and the constraint node update comprise a complete iteration. (As remarked above, the variable and constraint node processing may occur concurrently.)

Various node processor features of the present invention will now be described in the context of the exemplary LDPC decoder system 600 shown in FIG. 6. We shall describe a particular set of computations and message formats which may be used for LDPC decoding in accordance with the present invention. It is to be understood that the same computations, described in implementing node processors in the serial decoder of FIG. 6, could be used in parallel implementations where a plurality or all messages for a given node arrive at the processor simultaneously and node processing of the plurality or all messages proceeds at once. Moreover, the node processor may be replicated to provide parallel processing of several nodes at once.

Let us give a precise description of an exemplary five-bit message based algorithm which embodies the present invention. Input soft values and messages are in log-likelihood ration form and quantized in multiples of $\delta=\ln 2$ in accordance with the invention. Thus, the five bits of a message represent possible integer values $\{-15, -14, \ldots, -1, 0, 1, \ldots, 15\}$. In practice it is convenient to represent these soft values as "sign and magnitude". A sign takes the value 0 or 1 indicating the preferred value, e.g., the associated hard decision, for the associated bit. The magnitude indicates the reliability of the sign: Larger magnitudes indicate higher reliability. (It is generally a good idea to limit input soft values magnitudes to the range $\{0, 1, \ldots, M\}$ for some $M<15$. Note also that in this representation there are actually two '0' magnitude values, one with sign 0 and one with sign 1.) We will therefore write a message as a pair $(m_p, m_r)$ where $m_p$ denotes the sign bit and $m_r$ denotes the reliability, a four bit non-negative value in our example. Given such a message let us use m to denote the representative scaled log-likelihood ratio, i.e., $m=(-1)^{m_p} m_r$. The update formula for the variable nodes is given by $$m^{V2C}(j) = y + \sum_{i=1}^{d} m^{C2V}(i) - m^{C2V}(j).$$

When the outgoing message $m^{V2C}(j)$ has the value 0 the sign may be chosen arbitrarily. When the outgoing message magnitude exceeds 15 it is saturated, e.g., set to 15.

Figure 7:
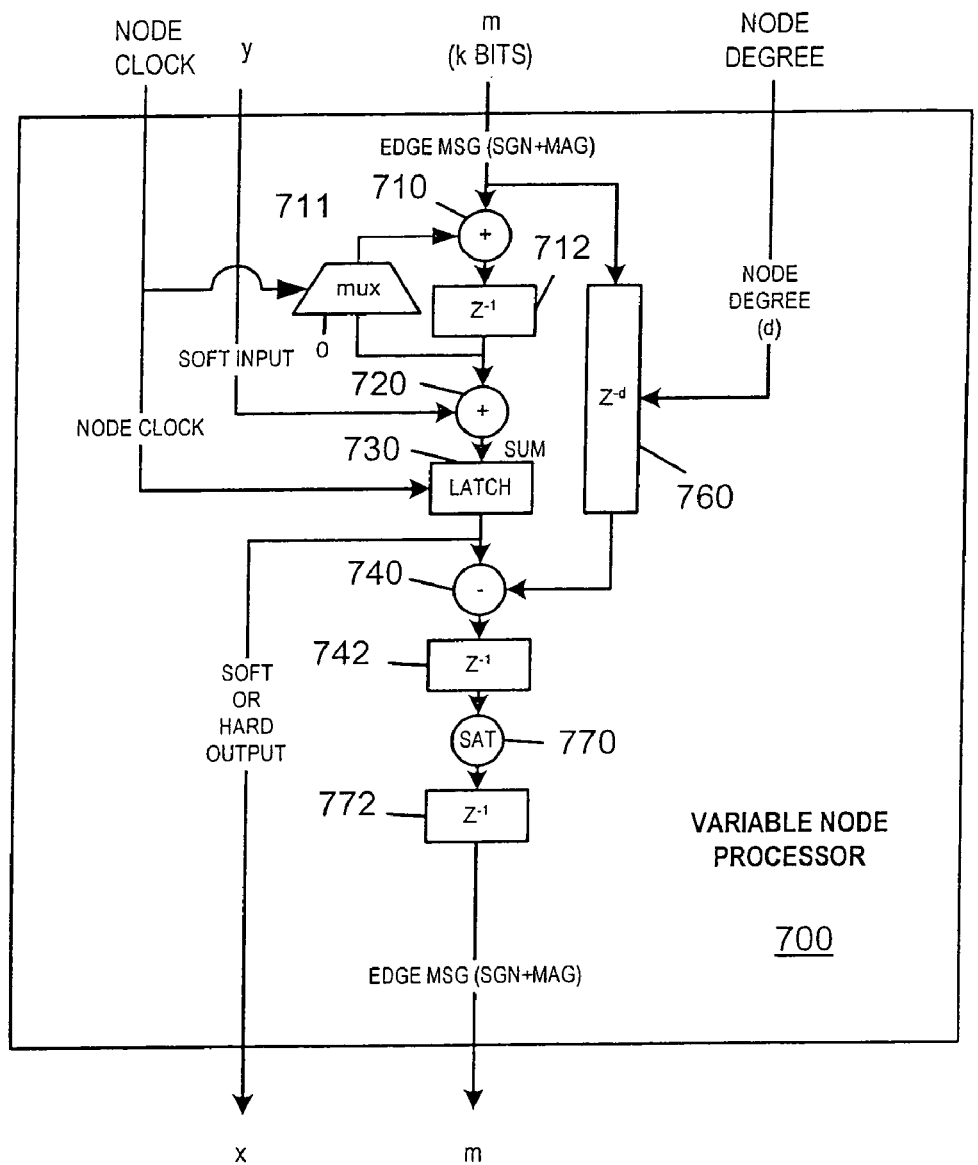
FIG. 7 illustrates an implementation of a variable node processor.
Figure 8:
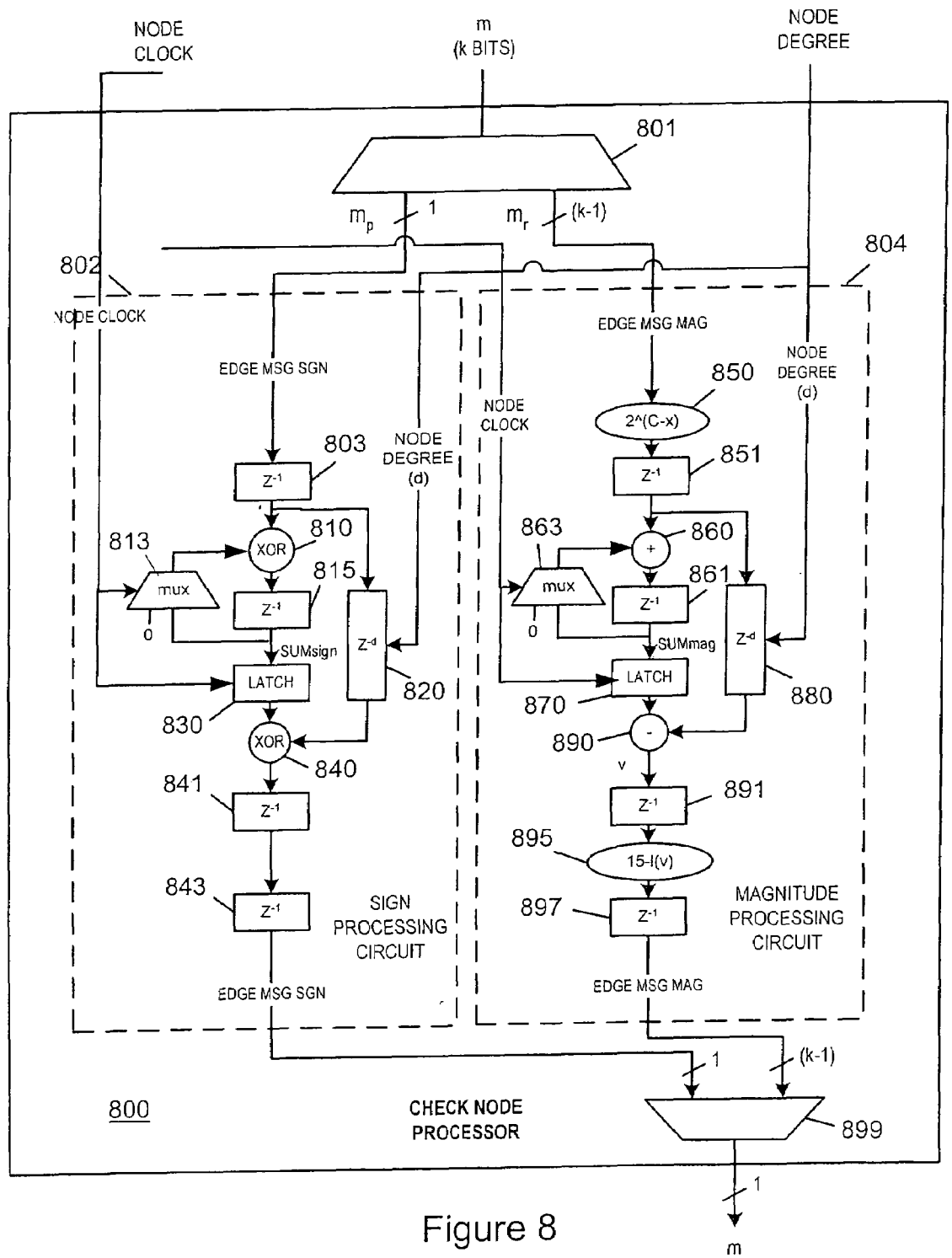
FIG. 8 illustrates an implementation of a constraint node processor.

FIGS. 7 and 8 illustrate an exemplary implementation of this rule for the serial decoder described above. FIG. 7 illustrates an implementation of a variable node processor 700 suitable for the decoder depicted in FIG. 6. Messages (m) for a particular variable node arrive in sequence. Each message, m, includes K bits. Each received message is summed by the summer 710 with a previous sum, i.e., an accumulated message sum, output by unit delay element 712. The accumulated message sum supplied to summer 710 is reset to "0" with the receipt of a message corresponding to a new node. The received soft input value y is added in adder 720 to the accumulated message sum output by delay 712, to form a new accumulated sum SUM. When all messages corresponding to the node being processed have been added to form a complete accumulated total sum, the value SUM is latched and stored in latch 730. This latching occurs as the result of an external node clock signal whose timing is controlled to guarantee that the complete sum is latched. The node clock signal is determined as a function of the node degree.

Each received message is also passed through a delay line including variable delay element 760 whose duration corresponds to the degree of the node being implemented.

The first message associated to the particular variable node being processed emerges from the delay line and the message's value is subtracted from the latched total sum stored in latch 730 by adder 740. The outgoing result is subsequently passed through a saturation operator 770 to ensure that the outgoing message value is in the desired range, e.g., limited to K-bits. Unit delay elements 742 and 772 positioned before and after saturation operator 770 are used to synchronize variable node processing operations with constraint node processing operations.

FIG. 8 illustrates an implementation of a constraint node processor 800 suitable for use in the decoder depicted in FIG. 6. The check node processor 800 includes a splitter circuit 801, a sign processing circuit 802, a magnitude processing circuit 804 and a combining circuit 899. As in the case of the variable node processor 700, messages m for a particular check node arrive in sequence. The constraint node update is separated into sign and magnitude update processing with divider 801 being used to separate the sign bit from the magnitude information in the message. The single sign bit of the received message is split off by separating circuit 801 and supplied to a sign bit processing circuit 802 for processing. The remaining K-1 bits of the K-bit message, m, are supplied to a message processing circuit 804. In addition, node clock and node degree signals are supplied to corresponding inputs of both the sign and magnitude processing circuits 802, 804.

We will first describe the sign update processing as performed by sign processing circuit 802. Incoming sign bits are delayed one clock cycle by unit delay element 803 prior to being supplied to an input of exclusive OR (XOR) logic circuit 810. XOR circuit 810 performs an exclusive-or or modulo 2 sum of the incoming sign bit and a previous XOR result which is delayed by a second unit delay element 815 prior to being supplied to a second input of the XOR circuit 810. In this manner, XORing of all the sign bits corresponding to the node being processed produces a total XOR result or product, $\text{SUM}_{sign}$, through iterative processing. The value $\text{SUM}_{sign}$ is stored in latch 830 under control of the node clock signal 830 for subsequent XORing with delayed sign bits corresponding to the node. MUX 813 is used to output the value 0 to be XORed with the sign bit of the first message corresponding to a node. At other times it outputs the delayed XOR result.

In addition to being passed through the XOR path beginning with delay element 803, each sign bit is also passed through a delay line which includes variable delay element 820. The delay of element 820 is controlled by the node degree signal so that the duration of the delay imposed on the sign bit will correspond to the degree of the node. When all sign bits corresponding to a node have been combined the total sum (exclusive-or), which we denote as $\text{SUM}_{sign}$, is stored in latch 830. The latching of the value $\text{SUM}_{sign}$ occurs under the direction of an external node clock signal as in the variable node update process discussed previously. This signal is also used to control the output of MUX 813.

As in the variable node update, the sign bits emerge from the delay line in sequence. The value of the delayed sign bit is subtracted (exclusive-or operation) from $\text{SUM}_{sign}$ in an adder 840. The result constitutes the sign of the outgoing message. Note that some additional delay elements 841, 843 have been inserted into the processor 802, to keep the sign update synchronized with magnitude update performed by circuit 804.

We will now describe the magnitude update processing performed by magnitude processing circuit 804. In the first step incoming magnitudes $m_r^{V2C}(i)$, represented using (K−1) bits, are converted to constraint domain values. This amounts to replacing the message $m_r^{V2C}(i)$ with the value $C2^{-m_r^{V2C}(i)}$ using transform circuit 850. The goal of this transform process is to represent the message values in a form in which constraint processing can be implemented through the use of simple sums and subtractions. In practice this transform can be implemented as a shift operation: the value C is stored in binary form and it is shifted to the right by $m_r^{V2C}(i)$ to obtain the transformed message. For the 5 bit decoder example the value C found to be effective is given by 6000 in hexadecimal notation.

Figure 9:
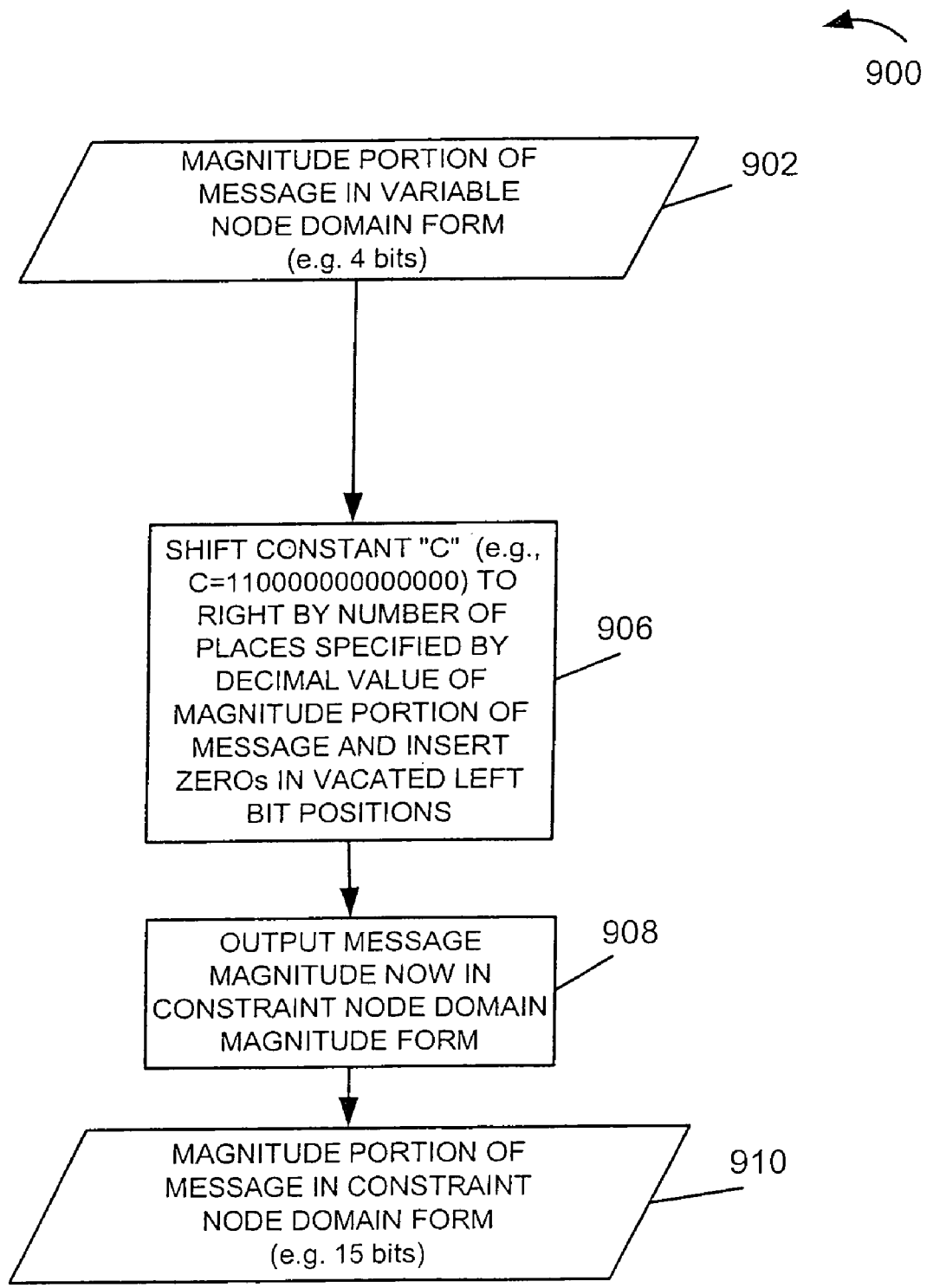
FIGS. 9 and 10 illustrate first and second transform operations, respectively, associated with constraint node processing where ln2 quantization step sizes are used with 5 bit messages.

See FIG. 9 for a detailed flow chart explaining the forward transform process 900 of changing from the more compact, e.g., 4 bit, variable node domain representation of the magnitude portion of a message to the longer, e.g., 15 bit constraint node domain representation of the magnitude portion of a message. In step 906, a constant C, used to convert between the variable node and constraint node domains, is shifted to the right by the decimal value (number) of places indicated by the magnitude portion of the received message. In addition, zeros are inserted in the left bit positions (high order bits) vacated as a result of the shift operation.

For example, assume an input in step 902 of the 4 bits (0010) which has a decimal value of 2. In step 906, the binary constant C=110000000000000 will be shifted two places to the right and the leftmost bits will be padded with zeros resulting in a constraint node (binary) domain magnitude value of 001100000000000.

In step 908, the magnitude portion 910 (e.g., 15 bits) of the message now in constraint node form is output for further processing. The output value represents a transformed magnitude value suitable for constraint node processing through addition operations.

Referring once again to FIG. 8 it can be seen that the transformed magnitudes are passed through unit delay element 851 prior to being supplied to summer 860 and variable delay element 880.

A sum of transformed edge message magnitudes is created by using summer 860 to add the edge message output by delay element 851 to the delayed output of the summer 860 thereby creating an accumulated sum, $\text{SUM}_{mag}$. The accumulated sum, $\text{SUM}_{mag}$, is stored in latch 870 upon receipt of the node clock signal indicating that all the edge messages corresponding to the node have been summed together. The node clock signal is also used to control mux 863 to output a "0" when the first message corresponding to a node is supplied to summer 860. Thus, mux 860 allows for the resetting of the accumulated sum at the start of processing of messages corresponding to each of a plurality of nodes.

The delayed transformed edge message magnitudes subsequently emerge from the delay line 880 and their values are subtracted from the stored sum $\text{SUM}_{mag}$ in an adder 890 prior to being supplied to unit delay element 891. Then, an inverse transform is performed on the delayed outgoing magnitude obtained from delay element 891 by transform circuit 895.

Figure 10:
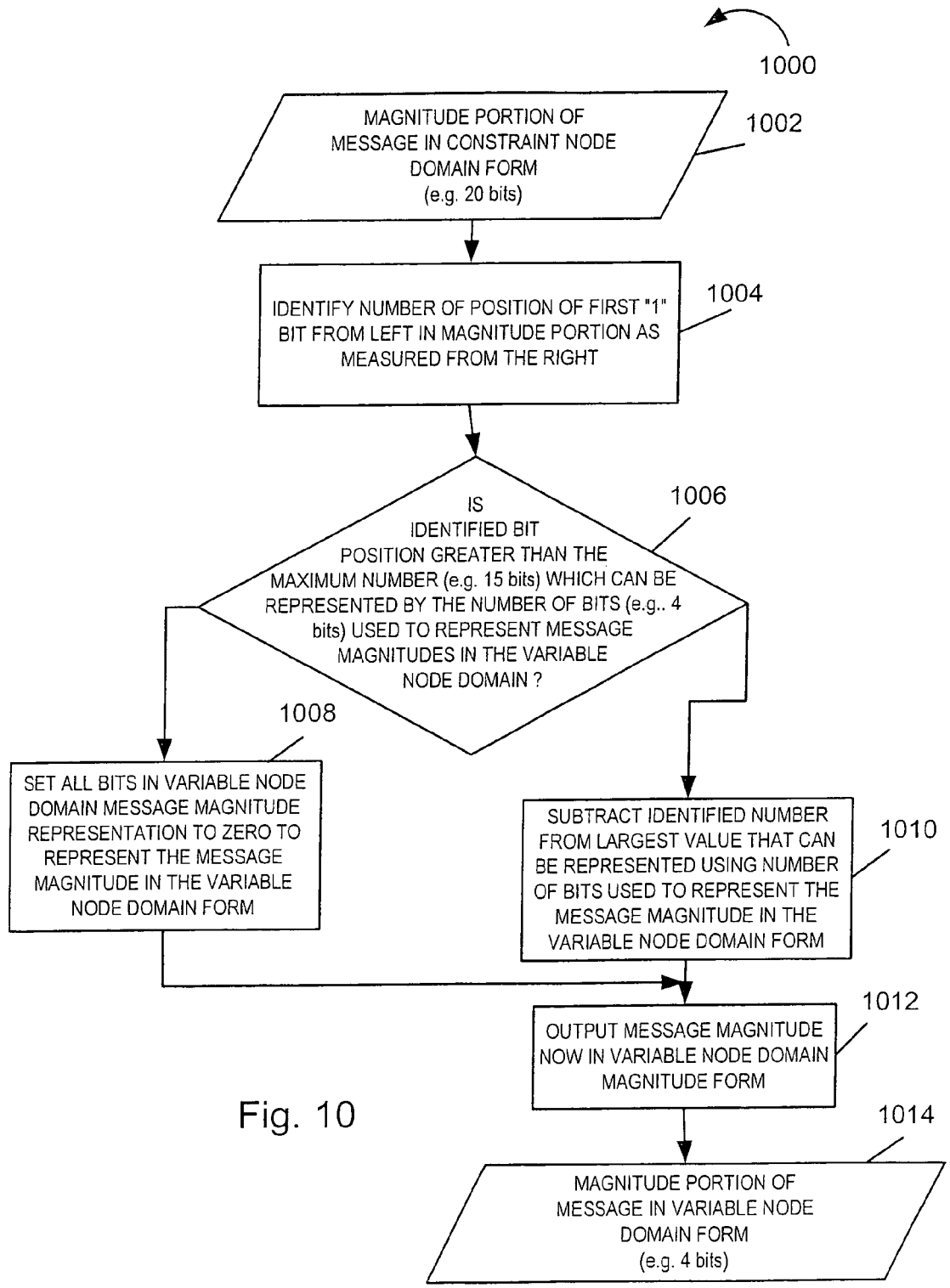

This second transform circuit, which performs a transform from the constraint node to the variable node message representation, in one exemplary embodiment, operates as follows. A priority encoder determines the location of the first 1 in the binary representation of the constraint domain magnitude message. Let us express this location from the right. Therefore, let v denote a constraint domain magnitude and let 1 (v) denote its "location". In general, if the decimal integer value of v is in the range from $2^j$ and $2^{j+1}-1$ inclusive, then $1(v) = j$. If v is 0 then $1(v)$ is 0. If $1(v)$ is greater than or equal to 15 (in the case of 4 bit variable node message magnitudes) then the outgoing magnitude is set to 0. Otherwise the outgoing magnitude is $15-1(v)$ FIG. 10 is a flow chart illustrating the transform process 1000 performed in step 895 which involves the conversion of the message magnitude value from the constraint node domain back into the variable node domain representation. Note that at this point the message magnitude may include more bits (e.g., the message be 20 bits long) than at the output of step 850 (e.g., where the message was 15 bits long), due to the message summing and subtraction operations performed in steps 860 and 891.

In step 1004, the magnitude portion 1002 of a message in constraint node domain form is received and the position of the first "1" from the left is determined by counting bit positions from the right. For example, if the magnitude portion 1002 was (00000010000000000100) a priority encoder could be used to determine that the first 1 bit from the left occurs in bit position 14 as measured from the right.

Next, in step 1006, the determined bit position is compared to the maximum value which can be represented by the number of bits used to represent the message magnitudes in the variable node domain form. For example, if 4 bits were used for message magnitudes in the variable node domain the maximum value would be 15. In such a case, if the determined bit position was greater than 15 operation would proceed to step 1008. Otherwise operation proceeds from step 1006 to step 1010.

In step 1008 all the bits in the variable node domain message magnitude representation, e.g., 4 bits, are set to zero thereby generating the variable node domain form of the received constraint node message magnitude 1002.

The processing in step 1010, will now be described. In step 1010, the message magnitude in the variable domain form is generated by subtracting the number of the identified bit position obtained in step 1006 from the largest value that can be represented using the number of bits used to represent the message magnitude in the variable node domain form. For example, assuming a 4 bit magnitude representation in the variable node domain, in step 1010 the bit position from step 1006, e.g., 14 in the case of the example, would be subtracted from 15 resulting in a variable node message magnitude of (15−14=1) one represented in binary as (0001).

In step 1012 the message magnitude 1014 now in variable node domain magnitude form is output, e.g., to delay element 897.

In some implementations of the constraint node processor it will be more convenient to store reliabilities in the delay line 880 in the variable domain form rather than the constraint domain form. This can reduce complexity since the variable domain form requires significantly fewer bits than the constraint domain form. To modify FIG. 8 for this embodiment the functional block 850 would be replicated at the output of the delay line 880 and the input to the delay line would be taken before the functional block 880 rather than after.

It will be appreciated that, although we use 5 bit variable node messages in the above examples (1 sign bit and 4 magnitude bits), the described rules can be applied to messages having fewer or more bits simply by decreasing or increasing the utilized range and adjusting constants as necessary.

It will also be appreciated that in some cases a spacing of 2ln2 for the log-likelihood ratios may be more desirable than the discussed exemplary ln2 spacing. This case will typically be used in conjunction with messages comprised of fewer bits. The change from ln2 to 2ln2 will change the update rules discussed above at the constraint nodes but not the variable nodes. The modification at the constraint nodes amounts to noticing that all messages are as in the case for ln2 spacing but only even valued magnitudes are allowed and, in this case, the last bit of the magnitude will always be 0 and need not, and in various embodiments will not, be passed as part of the message.

Figure 11:
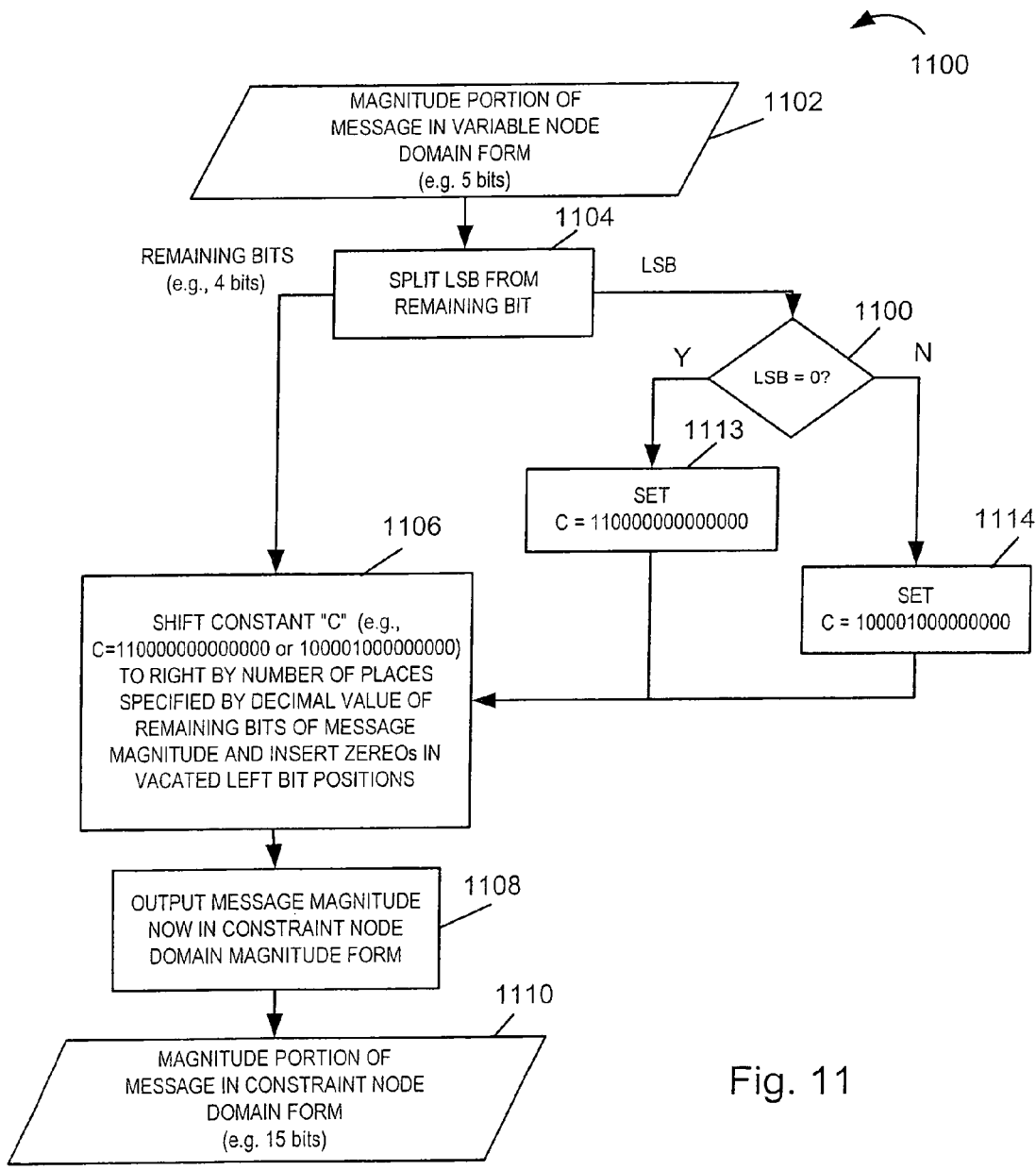
FIGS. 11 and 12 illustrate first and second transform operations, respectively, associated with constraint node processing where ½ ln2 quantization step sizes are used with 6 bit messages.
Figure 12:
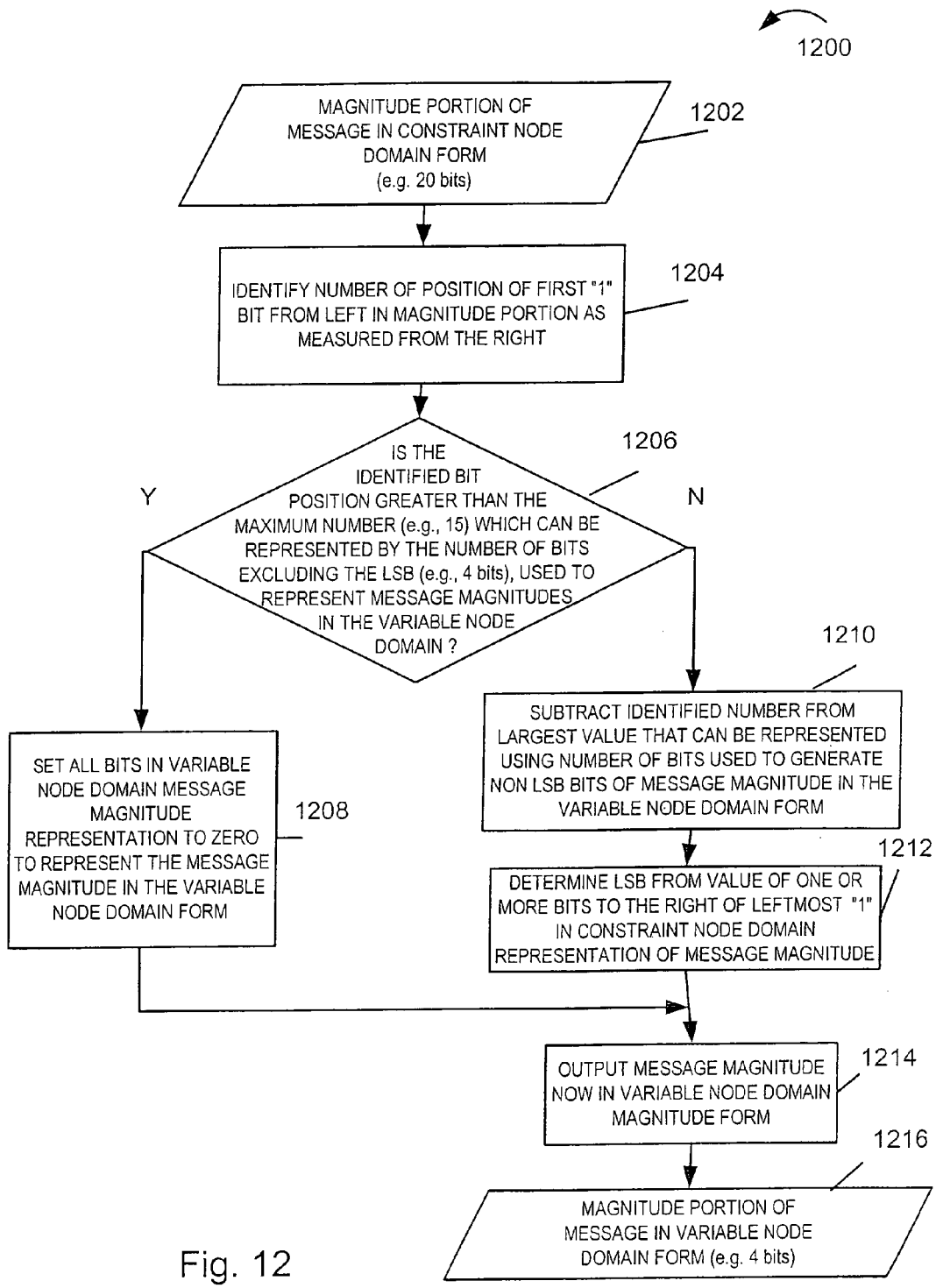

In some other cases a spacing of ½ ln2 may be preferable. FIGS. 11 and 12 depict the forward and reverse transformation processes 1100, 1200 for ½ ln2 spacing embodiments, which correspond to the transforms shown in FIGS. 9 and 10, respectively, for the ln2 spacing embodiment. Again, the update rules, e.g., transform operations 850 and 895, change at the constraint nodes but not the variable nodes. When the least significant bit (right most bit in this case given the bit ordering) of the magnitude is 0 the transformation to the constraint node domain proceeds as in the ln2 spacing case except that the least significant bit, e.g., the fifth bit in a 5 bit magnitude representation, of the incoming magnitude is dropped, i.e., the message magnitude value is shifted to the right by one, or, equivalently, divided by 2. When the least significant bit is a 1 the same operation is performed but the constant C used in the transformation will be different. In such a case the constant C will be replaced by a slightly smaller value falling in between C and C/2. Constraint node processing proceeds as before up to the point of the inverse transformation using the remaining bits of the magnitude portion of the message being processed.

FIG. 11 illustrates the process 1100 of transforming a magnitude message portion 1102 in the variable node domain form to the constraint node domain form in the case where ½ ln2 spacing is used. As illustrated in step 1104, the LSB, e.g., bit 5 is split from the magnitude portion of the message and supplied to step 1100 while the remaining bits, e.g., the 4 higher order bits are supplied to step 1106. In step 1100 the LSB is compared to zero to determine which value should be used for the constant C in the transform process. If the LSB=0, operation processes to step 1113 where C is set to a first value 110000000000000. However, if the LSB=1, operation proceeds from step 1100 to step 1114 where C is set to a second value 100001000000000. The value C is supplied from step 1113 or 1114 to step 1106 which also receives the remaining higher order bits, e.g., 4 bits, of the message magnitude portion 1102.

In step 1106 the constant C is shifted to the right by the number of places specified by the decimal value of the remaining bits (e.g., 4 bits) of the message magnitude and zeros are inserted into the left bit positions vacated as a result of the shift operation. Then in step 1108 the message magnitude 1110 (15 bits), now in constraint node domain magnitude form, are output to e.g., delay element 851.

In the ½ ln2 case, the inverse transformation, e.g., constraint node domain representation to variable node domain representation, involves an additional step beyond that present in the ln2 spacing case which is used to determine the least significant bit of the outgoing message. The value obtained using the ln2 spacing rule provides the other, higher order, bits in the message.

To determine the value of the least significant bit in the ½ ln2 case, some bits to the right of the first 1 of the constraint node domain magnitude are examined. A threshold is used to determine whether the least significant bit will be 0 or 1. In one particular ½ ln2 embodiment, the constraint node domain value v is compared with the threshold value $t\, 2^{1(v)}$ where t is some appropriate predetermined constant. If v is larger than $t\, 2^{1(v)}$ than the LSB is set to 0 otherwise it will be set to 1. It will be appreciated that there are many alternative implementations using the same threshold rule.

FIG. 12 illustrates the process 1200 of converting a magnitude portion 1202 of a message in constraint node domain form to variable node domain form. The processes begins in step 1204 wherein the location of the first "1" from the left as measured from the right is determined. A priority encoder may be used to perform this operation. Then, in step 1206 a determination is made as to whether the identified bit position is greater than the maximum number which can be represented by the number of bits, excluding the LSB used to represent the message magnitude in the variable node domain. For example, assuming 5 bits are used to represent magnitude in variable node domain, 5 bits-1 for the LSB=4 bits which allows for a maximum decimal value of 15. In such a case, in step 1206, a determination is made as to whether the identified bit position exceeds the maximum number 15. If the answer is yes, operation proceeds to step 1208. Otherwise operation proceeds to step 1212.

Processing proceeds to step 1208, as a result of a determination that the message magnitude should be set to zero. In step 1208, all bits in the variable node domain message magnitude representation are set to zero to generate the message magnitude (e.g., 00000) in the variable node domain form. With the transform complete, operation proceeds from step 1208 to step 1214.

In step 1210, which represents an alternative processing path to step 1208, the identified number, i.e., number of the bit position, is subtracted from the largest value that can be represented by the number of non-LSB bits of a message magnitude in the variable node domain form. For example, assuming a 5 bit magnitude representation in the variable node domain form, there are 4 bits in addition to the LSB. The largest number that can be represented by 4 bits is 15. Accordingly, in such an embodiment in step 1210, the number of the identified bit position would be subtracted from 15 to produce the 4 high order bits of the magnitude value in the variable node domain.

In step 1212, the LSB, e.g., the fifth bit of the 5 bit exemplary magnitude value, is determined from the value of one or more bits to the right of the leftmost "1" present in the magnitude value in the constraint node domain representation 1202 of the message magnitude.

In step 1214, the generated message magnitude 1216, e.g., 5 bits, now in variable node form is output, e.g., to unit delay element 897.

Figure 13:
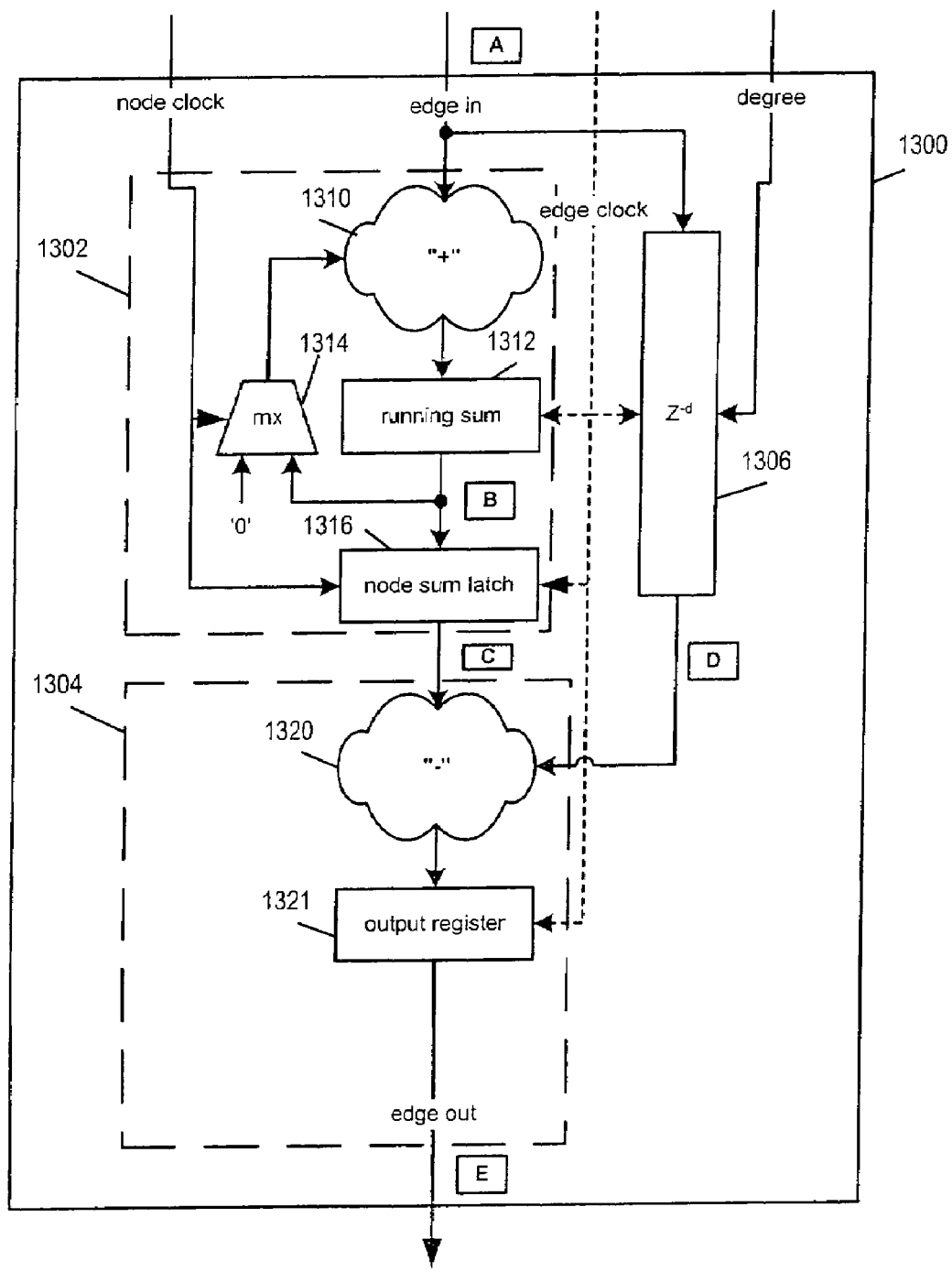
FIG. 13 illustrates the general structure of a node processor, implemented in accordance with the present invention, for use in a message passing decoder.

FIGS. 7 and 8 include one and two instances, respectively, of a basic structure which we further describe in reference to FIG. 13. Recall that the dominant computation for message updates has the simplified form:

$$m_{out}(j) = \sum_{i=1}^{d} m_{in}(i) - m_{in}(j)$$

and that it is desirable to have an efficient pipeline structure that can produce one outgoing edge message per clock cycle. The hardware design of the present invention gives due consideration to the following observations and supports the listed features:

there is no explicit dependency between input and output data, allowing the pipeline to be sufficiently deep to allow very high clock rate;

the pipeline is able to maintain it's efficiency while processing nodes of variable degree;

addition and subtraction in the formula above can be generalized to any operation that has an inverse and follows associative law (modulo addition/subtraction, multiplication/division etc);

the pipeline may include additional pre- and post-processing stages such as function transform, saturation, delay elements, etc.

A message processing system 1300, representing a generalized proposed pipeline structure, is illustrated in FIG. 13. The processing system 1300 sequentially receives input messages "A", one per clock cycle as determined by an edge clock signal used to drive the various system components. It also receives a node clock signal and a node degree signal. The node clock signal serves as a node framing signal and is asserted when a message corresponding to a new node is supplied to the message input of accumulator module 1302. As will be discussed below, the node clock signal is used to control various operations, including the initialization of a running message sum and the latching of a total sum, generated for each node. The node clock signal is generated as a function of the degree, e.g., number of messages, corresponding to the node for which processing is being implemented. The node degree signal indicates the degree of the node for which processing is being performed and thus the number of messages that correspond to the node. As will be discussed below, the node degree signal is used to control a variable delay element 1306 used to delay the received messages. Operation of the system 1300 will be discussed further below with reference to the corresponding data flow shown in FIG. 14. For simplicity any pre- and post-processing stages are skipped and simple addition and subtraction operations assumed.

The processing system 1300 comprises two computational stages, sometimes referred to as modules, i.e., an accumulation module "A" 1302 and a subtraction module "S" 1304. Since the subtraction module generates output messages it is sometimes also called a message generation module. The system 1300 also comprises a variable message delay path which includes a variable delay element 1306 which outputs delayed messages "D".

The accumulation module "A" 1302 receives input messages in sequence and generates, for each set of messages corresponding to a node, a total sum. Accumulation module 1302 comprises a summer 1310, unit delay element 1312, a mux 1314 and a node sum latch 1316. The unit delay element 1312 is used to store a running sum generated by summer 1310. MUX 1314 supplies either a zero or the running sum output by delay element 1312, to one of the inputs of summer 1310. The MUX is controlled by the node clock signal to output the zero when the first message corresponding to a node is supplied to the other input of the summer 1310 and the running sum B at all other times. In this manner, summer will add received messages corresponding to a node to generate a total sum for the node.

The node clock signal is also used to strobe the running sum into the node sum latch 1316. At the time the node clock signal is asserted and the value latched, the running sum represents a total sum for the node.

The subtraction or message generation module "S" 1304 receives as its input the total sum generated by the accumulation module 1302 and the input messages delayed by variable delay element 1306. Stage "S" 1304 sequentially subtracts delayed input messages from the total sum "C" stored in node sum latch 1316 producing output messages for a node, e.g., node N, one message per clock cycle. The results of the subtraction operation, an output message "E" is stored in an output register 1321 prior to being output by Operation of stages "A" 1302 and "S" 1304 can be fully overlapped or folded. For example, while stage "A" 1302 is performing processing for node N+1, stage "S" can perform processing for node N.

The purpose of variable delay line which includes delay element 1306 is to supply delayed original input messages, represented as "D", for node N to subtraction stage "S" while storing input messages for node N+1. The delay, in units of processing clock cycles, of delay element 1308, applied to messages corresponding to a node, equals the degree of the current node to which the messages correspond. For example, message corresponding to a node of degree 4 will be delayed four clock cycles by variable delay element 1306 while messages corresponding to a node of degree 2 will be delayed two clock cycles. To support multiple node degrees, in one embodiment, variable delay element 1306 is implemented with at least enough storage space to store as many messages as the highest node degree to be supported.

Use of the variable delay element 1306 and delayed message D saves message memory bandwidth by removing duplicated reads required for folded pipeline operation. Note that the delay line, including delay element 1306, can be practically implemented either with external delay value control (e.g. shift register with variable output tap) or with internal delay value control (e.g. self-contained FIFO). The first method may be preferable for vector decoders as the delay control logic can be shared across multiple processing nodes.

The pipeline structure described above allows the node degree to be changed on the fly by altering both the frequency of the node clock signal used for node framing signal and changing the degree signal used to control the message delay imposed by delay element 1306. Via these control signals, pipeline depth can easily be changed. In this context, the pipeline depth may be interpreted as the delay from the time the first incoming message (for node N) is fed into the system 1300 for processing to the time the first outgoing message E (for node N) appears at the pipeline output. Variable depth pipeline can offer significant performance advantage where irregular LDPC codes are to be supported since the total number of cycles required per iteration is equal to the number of edge edges in the graph plus the degree spread (the difference between the maximum and minimum degrees).

In contrast, a fixed pipeline design would require (maximum edge degree)*(number of nodes) cycles per iteration which can be noticeably larger than the number of edges, especially when degree spread is large.

Figure 14:
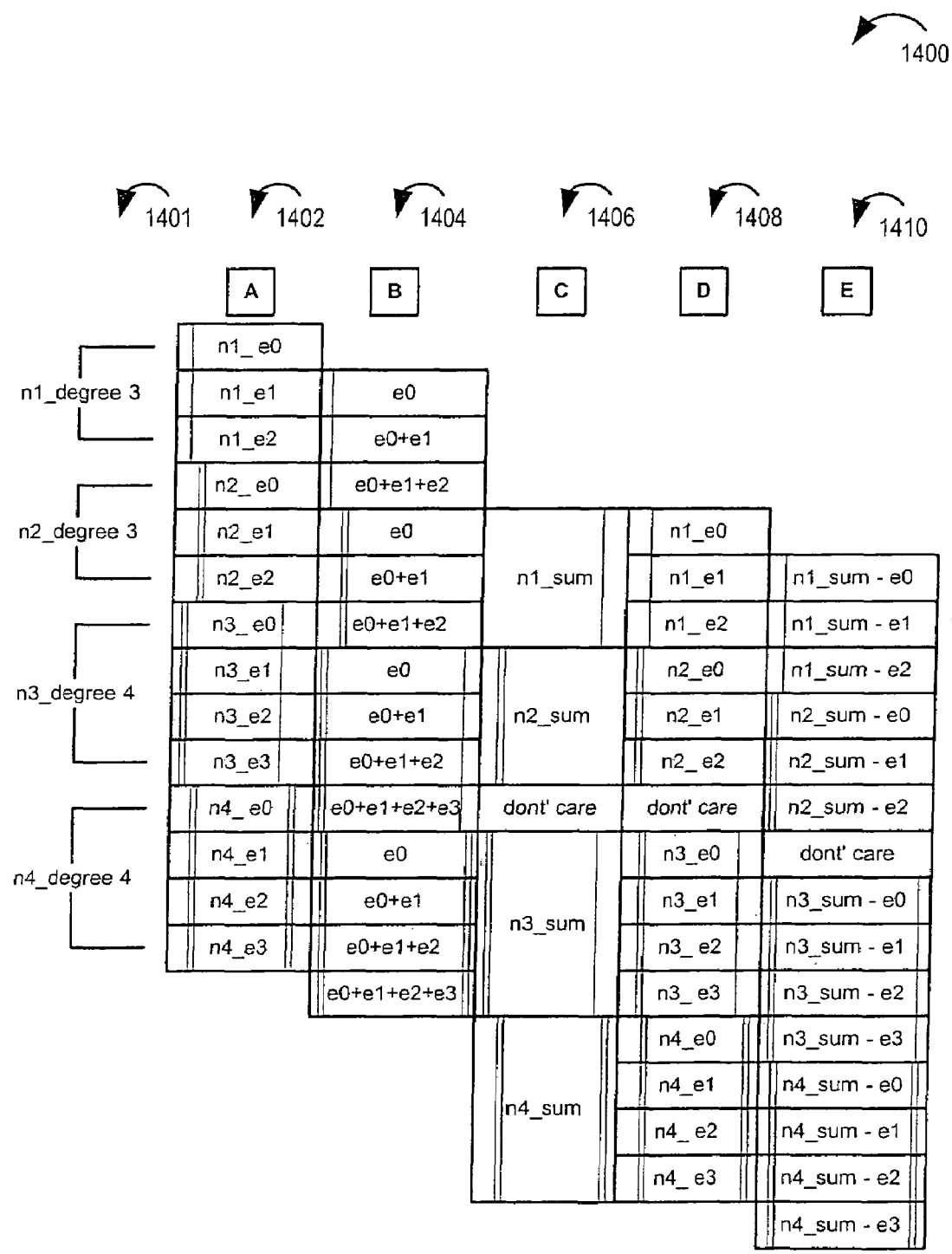
FIG. 14 illustrates various messages and values generated during the processing of messages corresponding to nodes of different degrees, in sequence, by the node processor illustrated in FIG. 13.

FIG. 14 illustrates a chart 1400 which includes an example of the various values, A through D, present in the system 1300 at a point in time where a switch from node degree 3 to node degree 4 occurs. Note that there are no pipeline stalls, e.g., delays with respect to input data arrival, due to the switch in node degree.

FIG. 14 illustrates the processing associated with messages corresponding to four nodes, node 1 (n1), node 2 (n2), node 3 (n3) and node 4 (n4). Cells in the FIG. 14 chart including a single line correspond to n1. Cells which include two lines correspond to n2. Cells which include three lines correspond to n3. In addition, cells which include four lines correspond to n4. As illustrated in the first column 1401, nodes n1 and n2 are of degree 3 while nodes n3 and n4 are of degree 4. Each row in chart 1400 corresponds to a different clock cycle while columns correspond to different values as indicated.

The second column 1402 lists the received messages A, in the order they are received, one per clock cycle. The third column 1404 lists the running sum B, during each processing clock cycle. Note that in column 1404, the node indicator, e.g., n1 from the message n1_e0, is omitted in column 1404 for the purposes of brevity. The fourth column 1406 lists the latched total sum C generated for each node as part of the message processing. The fifth column 1408 lists the delayed value D output by the delay element 1306 which is subtracted from a sum in column C to produce the output message E. The generated output messages are listed in the sixth column 1410.

Naturally, due to pipeline depth change, empty slots occur in the output data stream. If nodes are sorted by degree in monotonic order (increasing or decreasing) the total number of empty slots per iteration is equal to degree spread and is very small compared to number of messages processed, consequently very high pipeline utilization is achieved.

The above described LDPC decoding methods and node processor implementations allow for LDPC decoding to be performed on various hardware platforms such as Field Programmable Gate Arrays or in an Application Specific Integrated Circuit. The present invention is especially useful in these settings where the simple parallelism and easy to implement nodes can be explicitly exploited.

Numerous additional variations of the decoding methods and apparatus of the present invention will be apparent to those skilled in the art in view of the above description of the invention. Such variations are to be considered within the scope of the invention.

What is claimed is:

1. An apparatus, comprising:
means for quantizing a value from a receiver, using quantization step sizes which are integer multiples of ½ In 2, to produce a quantized value; and
means for performing one of a check node processing operation and a variable node processing operation on said quantized value to produce at least a portion of an outgoing message communicating reliability information, said means for performing one of a check node processing operation and a variable node processing operation being coupled to said means for quantizing.

2. The apparatus of claim 1, wherein said means for quantizing includes:
input means for receiving log-likelihood values, said received value being a log-likelihood value.

3. The apparatus of claim 1, wherein said means for quantizing includes:
input means for receiving log-likelihood values including at least one of a log-likelihood ratio value and an approximation of a log-likelihood ratio value said received value being a value received by said input means.

4. The apparatus of claim 1, further comprising:
means for generating said received value by multiplying a detected value with a constant.

5. The apparatus of claim 1, wherein said means for quantizing the received value includes:
means for generating a sign bit and a magnitude value which in combination, comprise said quantized value.

6. The apparatus of claim 5, wherein said means for performing one of a check node and a variable node processing operation includes:
means for shifting a fixed number as a function of the magnitude value included in said quantized value to generate a transformed magnitude value: and
means for performing at least one check node processing operation on said transformed magnitude value to produce an outgoing transformed magnitude value.

7. The apparatus of claim 6, wherein said means for performing one of a check node and a variable node processing operation includes means for performing a second transform operation to generate a log-likelihood message magnitude value.

8. The apparatus of claim 7, wherein said means for performing one of a check node and a variable node processing operation further includes means for performing at least one check node processing operation on the sign bit of said quantized value to produce an outgoing sign bit value.

9. The apparatus of claim 8, wherein said means for performing one of a check node and a variable node processing operation further includes means for combining the outgoing sign bit value with the generated log-likelihood message magnitude value to produce a decoder message including said portion of an output message.

10. The apparatus of claim 9,
wherein said means for performing one of a check node processing operation and variable node processing operation is a constraint node processor used to generate said decoder message said decoder message being a constraint node to variable node decoder message.

11. The apparatus of claim 10, further comprising:
means for storing the constraint node to variable node decoder message in a memory: and
variable node processor means coupled to said memory for generating a variable node to constraint node message as a function of said constraint node to variable node decoder message.

* * * * *